(12) United States Patent
Takano et al.

(10) Patent No.: US 12,540,718 B2
(45) Date of Patent: Feb. 3, 2026

(54) ILLUMINATION DEVICE

(71) Applicant: Japan Display Inc., Tokyo (JP)

(72) Inventors: Daijiro Takano, Tokyo (JP); Takeo Koito, Tokyo (JP); Koichi Nagao, Tokyo (JP); Takayuki Imai, Tokyo (JP); Naoyuki Asano, Tokyo (JP); Daisuke Hamano, Tokyo (JP)

(73) Assignee: Japan Display Inc., Tokyo (JP)

( * ) Notice: Subject to any disclaimer, the term of this patent is extended or adjusted under 35 U.S.C. 154(b) by 0 days.

(21) Appl. No.: 19/191,266

(22) Filed: Apr. 28, 2025

(65) Prior Publication Data

US 2025/0251111 A1 Aug. 7, 2025

Related U.S. Application Data

(63) Continuation of application No. PCT/JP2023/029783, filed on Aug. 18, 2023.

(30) Foreign Application Priority Data

Nov. 2, 2022 (JP) .................................. 2022-176060

(51) Int. Cl.
*F21V 14/00* (2018.01)
*G02F 1/29* (2006.01)

(52) U.S. Cl.
CPC ............ *F21V 14/003* (2013.01); *G02F 1/294* (2021.01)

(58) Field of Classification Search
CPC ...... F21V 14/003; F21V 14/06; F21V 23/003; G02F 1/294; G02F 1/133504; G02F 1/133382
See application file for complete search history.

(56) References Cited

U.S. PATENT DOCUMENTS

| 12,320,478 | B2* | 6/2025 | Ikeda ................... H05B 47/155 |
| 2012/0169953 | A1* | 7/2012 | Kataoka ................ F21V 14/003 349/36 |
| 2013/0051036 | A1 | 2/2013 | Totani et al. |
| 2023/0375883 | A1* | 11/2023 | Kurokawa .......... G02F 1/13471 |

FOREIGN PATENT DOCUMENTS

JP 2013-048029 A 3/2013

OTHER PUBLICATIONS

International Search Report issued in corresponding PCT Application No. PCT/JP2023/029783, dated Oct. 24, 2023 and English translation of same. 6 pages.

* cited by examiner

*Primary Examiner* — Leah Macchiarolo
(74) *Attorney, Agent, or Firm* — K&L Gates LLP

(57) ABSTRACT

According to an aspect, an illumination device includes: two control substrates; two relay substrates electrically coupled to the two respective control substrates through respective wire harnesses; and four liquid crystal panels electrically coupled to the two relay substrates through flexible printed circuit boards. Four of the flexible printed circuit boards are provided. Two of the four liquid crystal panels are electrically coupled to one of the two relay substrates through the corresponding flexible printed circuit boards. The other two of the four liquid crystal panels are electrically coupled to the other of the two relay substrates through the corresponding flexible printed circuit boards. The four liquid crystal panels are provided in a state of being stacked in a first direction.

7 Claims, 31 Drawing Sheets

FIG.12
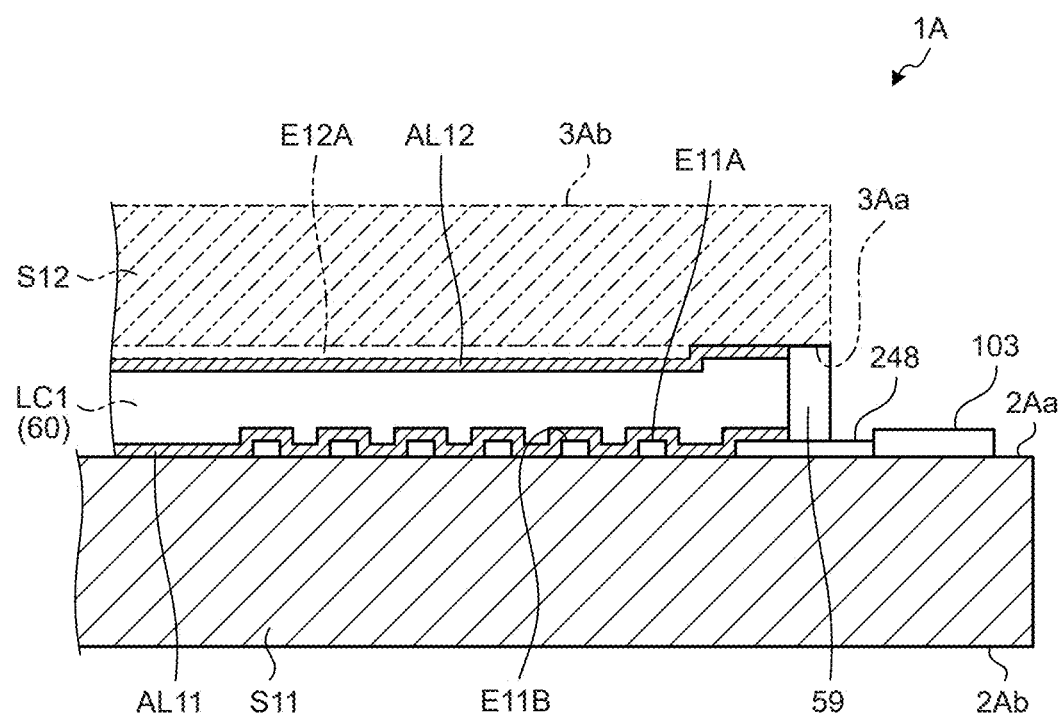
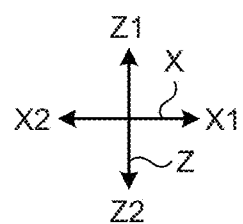

FIG.19B

| LIQUID CRYSTAL PANEL | TERMINAL | SUBSTRATE | ELECTRODE DIRECTION | POTENTIAL | POLARIZED LIGHT SUBJECTED TO ACTION | LIGHT DIFFUSION DIRECTION |
|---|---|---|---|---|---|---|
| 40 | 201 | SECOND | Y DIRECTION | D | P-WAVES | X DIRECTION |
| | 202 | FIRST | X DIRECTION | C | | Y DIRECTION |
| | 203 | FIRST | X DIRECTION | B | | Y DIRECTION |
| | 204 | SECOND | Y DIRECTION | A | | X DIRECTION |
| 30 | 201 | SECOND | Y DIRECTION | D | S-WAVES | X DIRECTION |
| | 202 | FIRST | X DIRECTION | C | | Y DIRECTION |
| | 203 | FIRST | X DIRECTION | B | | Y DIRECTION |
| | 204 | SECOND | Y DIRECTION | A | | X DIRECTION |
| 20 | 101 | SECOND | X DIRECTION | B | S-WAVES | Y DIRECTION |
| | 102 | FIRST | Y DIRECTION | A | | X DIRECTION |
| | 103 | FIRST | Y DIRECTION | D | | X DIRECTION |
| | 104 | SECOND | X DIRECTION | C | | Y DIRECTION |
| 10 | 101 | SECOND | X DIRECTION | B | P-WAVES | Y DIRECTION |
| | 102 | FIRST | Y DIRECTION | A | | X DIRECTION |
| | 103 | FIRST | Y DIRECTION | D | | X DIRECTION |
| | 104 | SECOND | X DIRECTION | C | | Y DIRECTION |

● HORIZONTAL LINE LIGHT DISTRIBUTION

●VERTICAL LINE LIGHT DISTRIBUTION

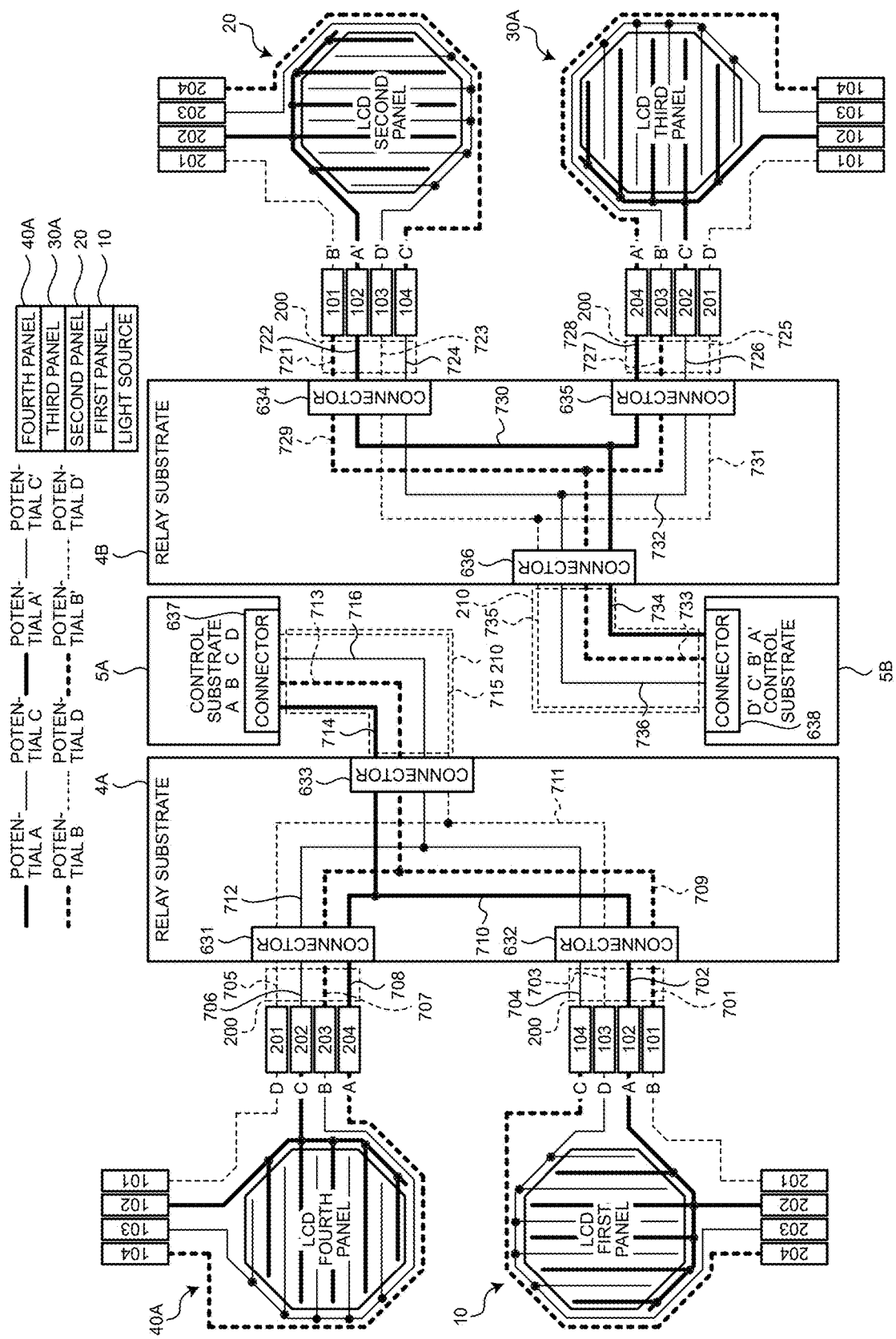

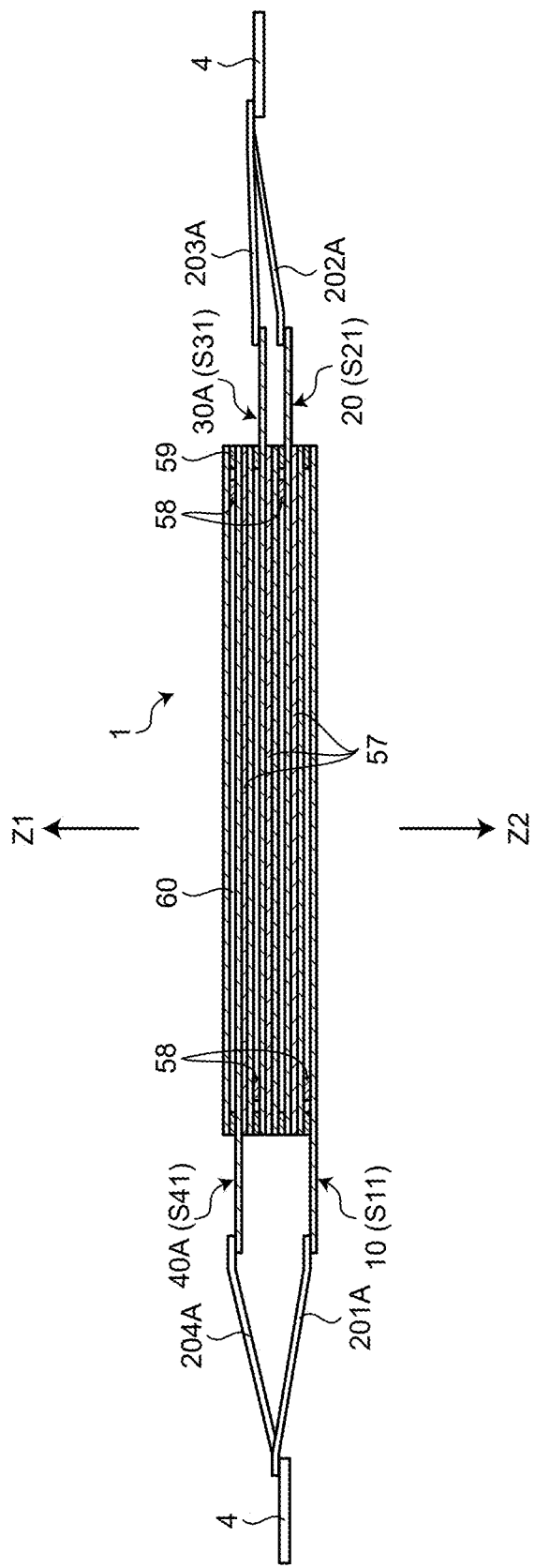

FIG.29B

| LIQUID CRYSTAL PANEL | TERMINAL | SUBSTRATE | ELECTRODE DIRECTION | POTENTIAL | POLARIZED LIGHT SUBJECTED TO ACTION | LIGHT DIFFUSION DIRECTION |
|---|---|---|---|---|---|---|
| 40A | 201 | SECOND | Y DIRECTION | D | P-WAVES | X DIRECTION |
| | 202 | FIRST | X DIRECTION | C | | Y DIRECTION |
| | 203 | FIRST | X DIRECTION | B | | Y DIRECTION |
| | 204 | SECOND | Y DIRECTION | A | | X DIRECTION |
| 30A | 201 | SECOND | Y DIRECTION | D' | S-WAVES | X DIRECTION |
| | 202 | FIRST | X DIRECTION | C' | | Y DIRECTION |
| | 203 | FIRST | X DIRECTION | B' | | Y DIRECTION |
| | 204 | SECOND | Y DIRECTION | A' | | X DIRECTION |
| 20 | 101 | SECOND | X DIRECTION | B' | S-WAVES | Y DIRECTION |
| | 102 | FIRST | Y DIRECTION | A' | | X DIRECTION |
| | 103 | FIRST | Y DIRECTION | D' | | X DIRECTION |
| | 104 | SECOND | X DIRECTION | C' | | Y DIRECTION |
| 10 | 101 | SECOND | X DIRECTION | B | P-WAVES | Y DIRECTION |
| | 102 | FIRST | Y DIRECTION | A | | X DIRECTION |
| | 103 | FIRST | Y DIRECTION | D | | X DIRECTION |
| | 104 | SECOND | X DIRECTION | C | | Y DIRECTION |

ILLUMINATION DEVICE

CROSS-REFERENCE TO RELATED APPLICATION

This application claims the benefit of priority from Japanese Patent Application No. 2022-176060 filed on Nov. 2, 2022 and International Patent Application No. PCT/JP2023/029783 filed on Aug. 18, 2023, the entire contents of which are incorporated herein by reference.

BACKGROUND

1. Technical Field

What is disclosed herein relates to an illumination device.

2. Description of the Related Art

An illumination device including a light source such as an LED is publicly known (refer to Japanese Patent Application Laid-open Publication No. 2013-48029 (JP-A-2013-48029), for example). The illumination device of JP-A-2013-48029 is an LED lamp including a base, an LED (light source), and a tubular member coupling the base and the LED. The tubular member is flexible, which allows the orientation of the LED relative to the base to be changed by bending the tubular member relative to the axial direction.

In a case where the shape (light distribution pattern) of emission light from an illumination device is not a circular shape centered at the optical axis (for example, the shape is elongated in one direction), the illumination device is desired to be capable of rotating the light distribution pattern about the axial center.

Such an illumination device is assumed to include, for example, a first tubular member, a second tubular member rotatably supporting the first tubular member, a liquid crystal panel fixed to the first tubular member, a control substrate fixed to the second tubular member and configured to control the liquid crystal panel, and wires electrically coupling the liquid crystal panel and the control substrate.

However, when the first tubular member to which the liquid crystal panel is fixed is rotated relative to the second tubular member to which the control substrate is fixed, the wires are twisted, and coupling portions between the wires and the liquid crystal panel or coupling portions between the wires and the control substrate is potentially damaged.

SUMMARY

According to an aspect, an illumination device includes: two control substrates; two relay substrates electrically coupled to the two respective control substrates through respective wire harnesses; and four liquid crystal panels electrically coupled to the two relay substrates through flexible printed circuit boards. Four of the flexible printed circuit boards are provided. TWO of the four liquid crystal panels are electrically coupled to one of the two relay substrates through the corresponding flexible printed circuit boards. The other two of the four liquid crystal panels are electrically coupled to the other of the two relay substrates through the corresponding flexible printed circuit boards. The four liquid crystal panels are provided in a state of being stacked in a first direction.

BRIEF DESCRIPTION OF THE DRAWINGS

FIG. 12 is a sectional view along line XII-XII in FIG. 10;

FIG. 19B is a diagram for entire description of polarized waves subjected to action of each of the four liquid crystal panels, the diffusion direction of the polarized waves, and the potential of terminals;

FIG. 27 is a schematic diagram illustrating the entire configuration of liquid crystal panels, relay substrates, and control substrates according to a second embodiment;

FIG. 28 is a sectional view illustrating a state in which four liquid crystal panels are stacked;

FIG. 29B is a diagram for entire description of polarized waves subjected to action of each of the four liquid crystal panels, the diffusion direction of the polarized waves, and the potential of terminals;

DETAILED DESCRIPTION

Aspects (embodiments) of the present disclosure will be described below in detail with reference to the accompanying drawings. Contents described below in the embodiments do not limit the present disclosure. Components described below include those that could be easily thought of by the skilled person in the art and those identical in effect. Components described below may be combined as appropriate.

What is disclosed herein is merely exemplary, and any modification that could be easily thought of by the skilled person in the art as appropriate without departing from the gist of the disclosure is contained in the scope of the present disclosure. For clearer description, the drawings are schematically illustrated for the width, thickness, shape, and the like of each component as compared to an actual aspect in some cases, but the drawings are merely exemplary and do not limit interpretation of the present disclosure. In the present specification and drawings, any element same as that already described with reference to an already described drawing is denoted by the same reference sign, and detailed description thereof is omitted as appropriate in some cases.

First Embodiment

First, an illumination device according to a first embodiment will be described below.

Configuration of Illumination Device

Figure 1:
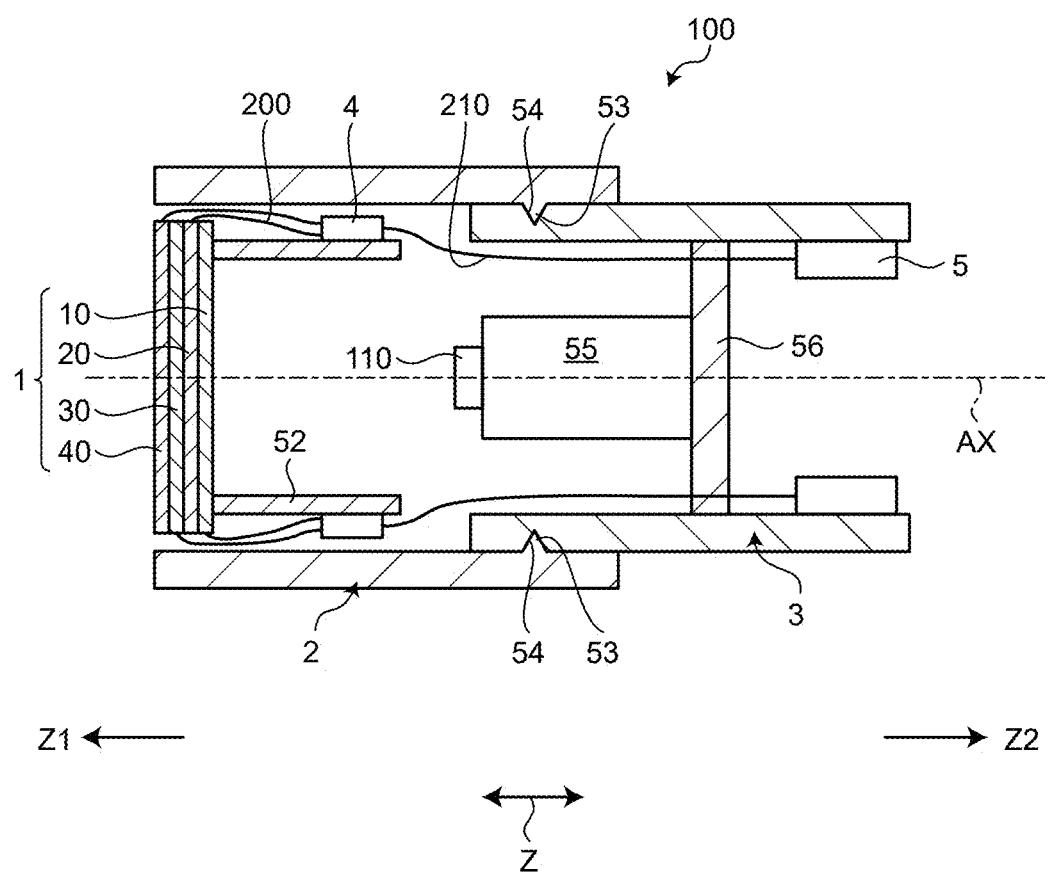
FIG. 1 is a schematic sectional view of an illumination device according to a first embodiment.
Figure 2:
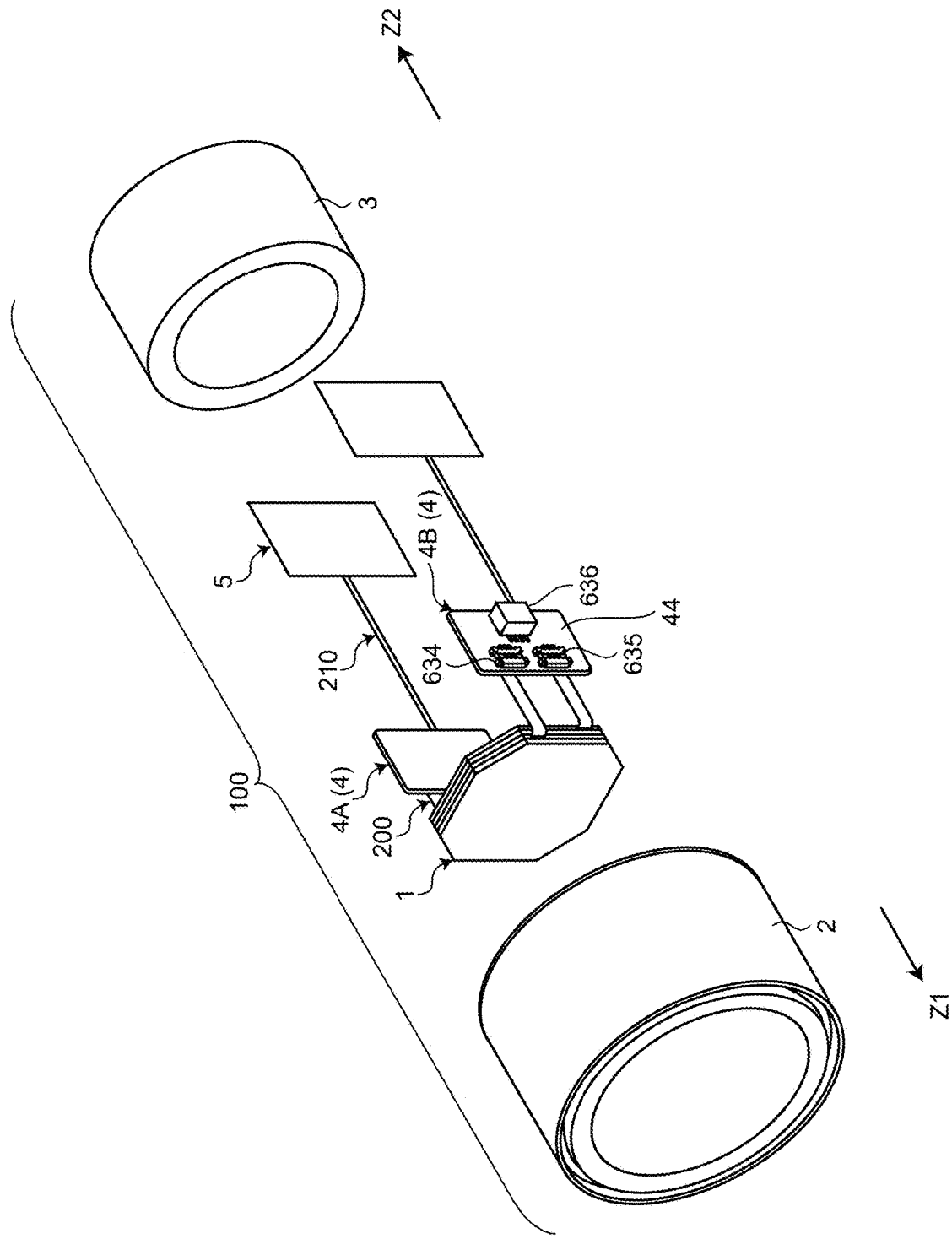
FIG. 2 is an exploded perspective view of FIG. 1.
Figure 3:
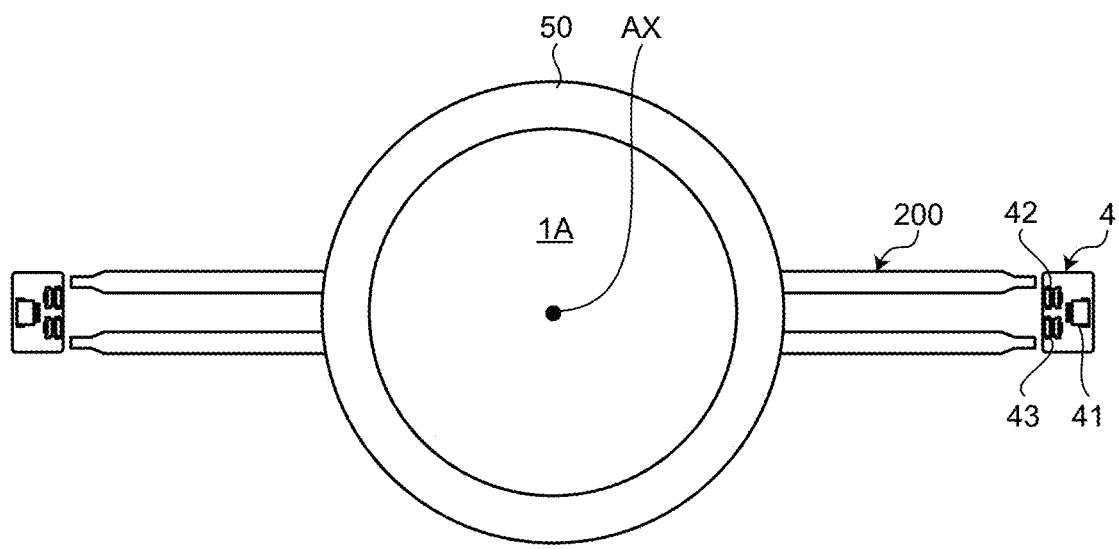
FIG. 3 is a schematic diagram of liquid crystal panels, flexible printed circuit boards, and relay substrates when viewed from the front side.
Figure 4:
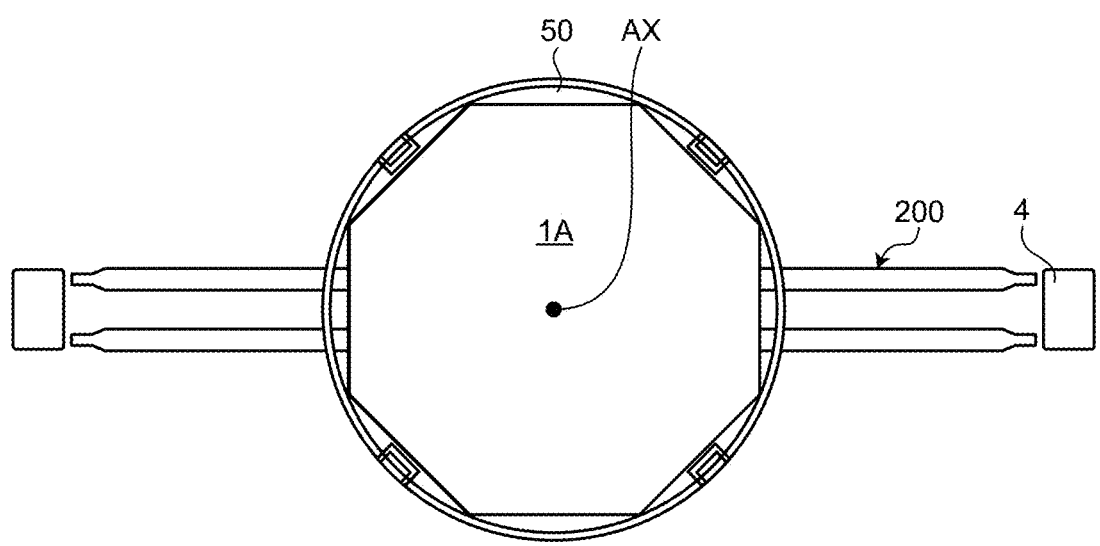
FIG. 4 is a schematic diagram of the liquid crystal panels, the flexible printed circuit boards, and the relay substrates when viewed from the back side.
Figure 5:
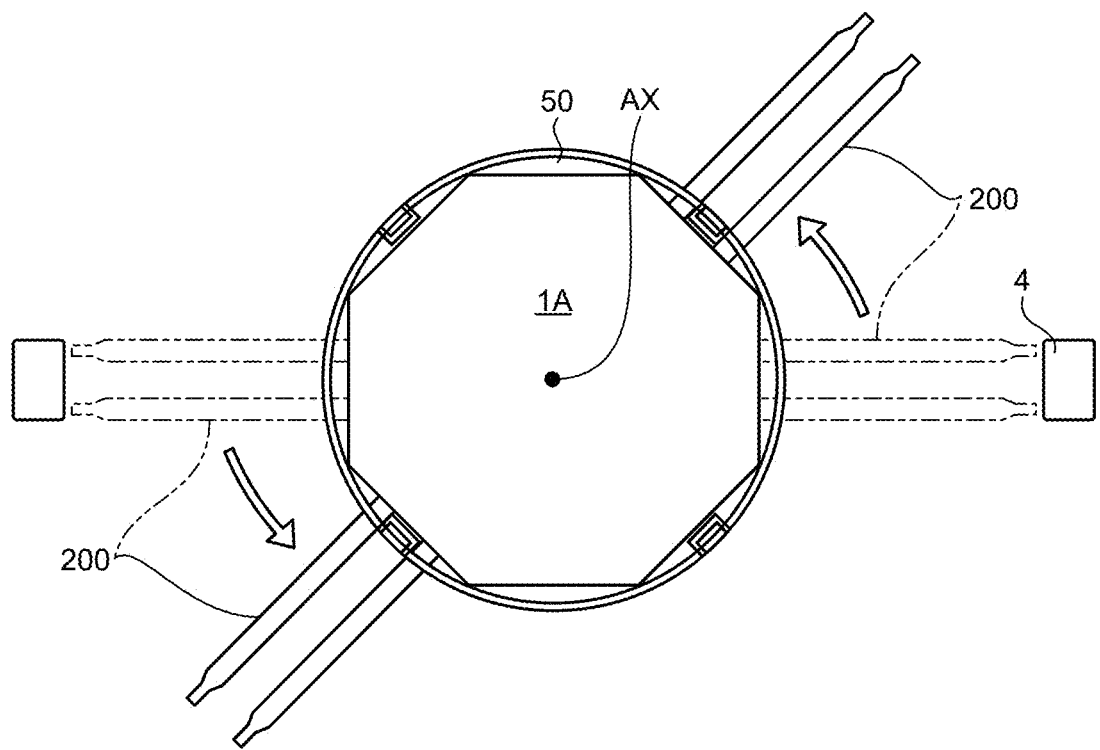
FIG. 5 is a schematic diagram illustrating a state in which the liquid crystal panels and the flexible printed circuit boards are rotated, corresponding to FIG. 4.
Figure 6:
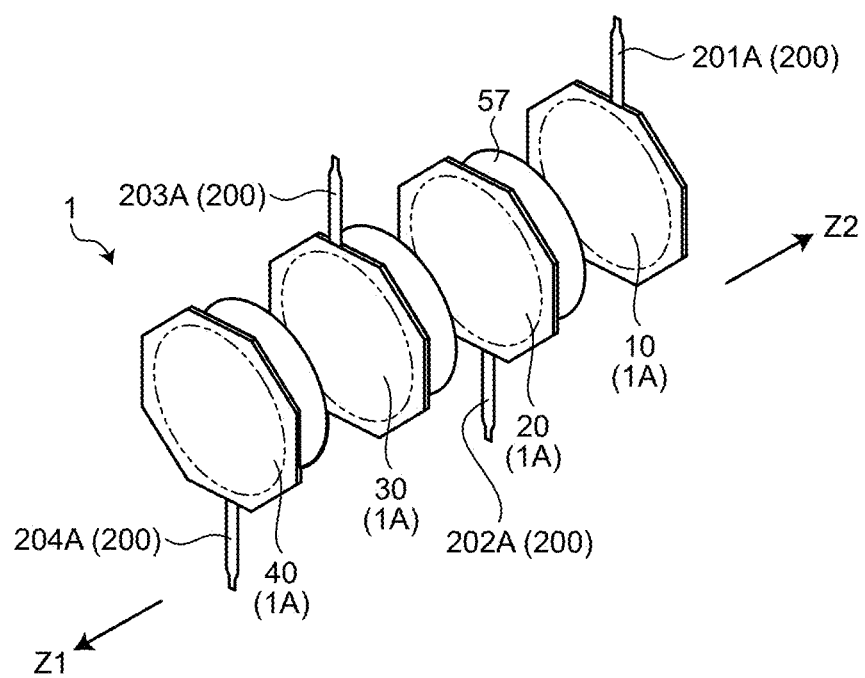
FIG. 6 is an exploded perspective view of four liquid crystal panels and the flexible printed circuit boards.
Figure 7:
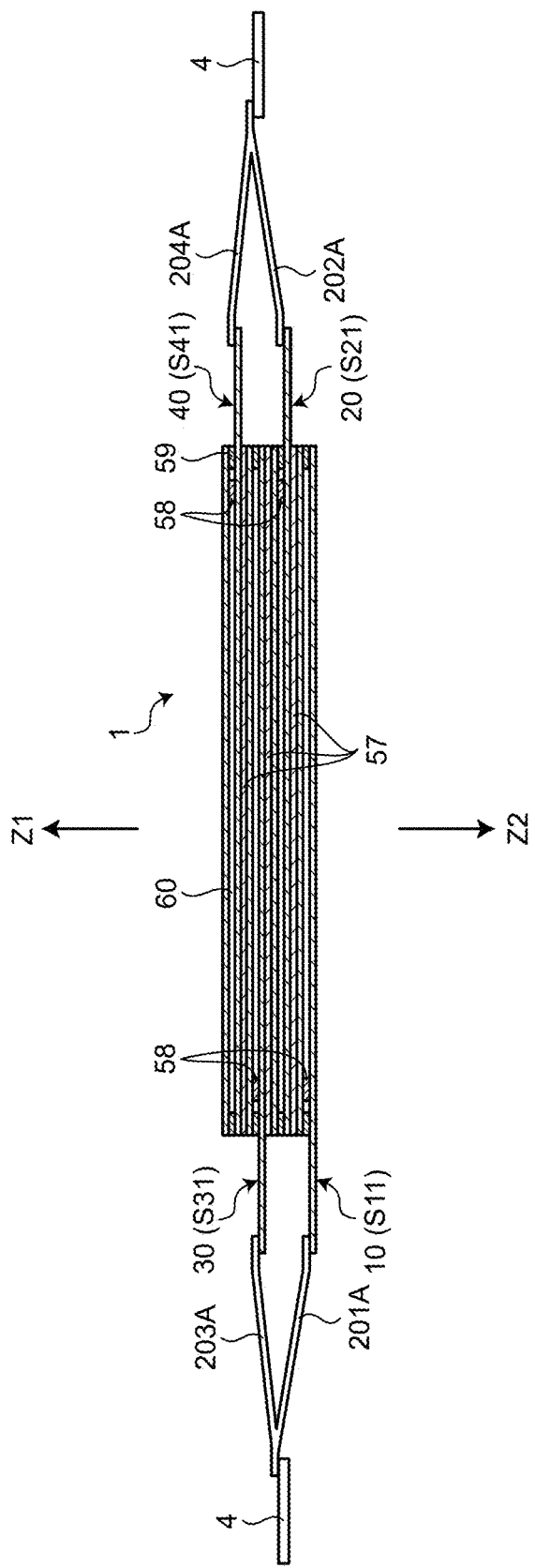
FIG. 7 is a sectional view illustrating a state in which the four liquid crystal panels are stacked.

FIG. 1 is a schematic sectional view of the illumination device according to the first embodiment. FIG. 2 is an exploded perspective view of FIG. 1. FIG. 3 is a schematic diagram of liquid crystal panels, flexible printed circuit boards, and relay substrates when viewed from the front side. FIG. 4 is a schematic diagram of the liquid crystal panels, the flexible printed circuit boards, and the relay substrates when viewed from the back side. FIG. 5 is a schematic diagram illustrating a state in which the liquid crystal panels and the flexible printed circuit boards are rotated, corresponding to FIG. 4. FIG. 6 is an exploded perspective view of four liquid crystal panels and the flexible printed circuit boards. FIG. 7 is a sectional view illustrating a state in which the four liquid crystal panels are stacked.

As illustrated in FIGS. 1 and 2, an illumination device 100 according to the first embodiment includes an optical element 1, a holding member 2, a held member 3, relay substrates 4, control substrates 5, flexible printed circuit boards 200, wire harnesses 210, and an LED (light source) 110.

The holding member 2 is a tubular member having a center axis AX. The holding member 2 rotates in a direction about the center axis AX relative to the held member 3. Accordingly, as illustrated in FIG. 5 to be described later, four liquid crystal panels 1A rotate in the direction about the center axis AX. The center axis AX extends in a Z direction (axial direction or first direction). In other words, the axial direction of the center axis AX is the same direction as the Z direction and the first direction. A protrusion 53 protrudes inward in the radial direction from the inner periphery of the holding member 2. The protrusion 53 is formed in a ring shape continuous across the entire inner periphery of the holding member 2.

The held member 3 is a tubular member having the center axis AX. A distal end part of the held member 3 is fitted to the inner periphery of the holding member 2. A recessed groove 54 that is recessed inward in the radial direction is provided at the outer periphery of the held member 3. The protrusion 53 of the holding member 2 is fitted to the recessed groove 54. With this configuration, the holding member 2 rotates in the direction about the center axis AX relative to the held member 3.

The optical element 1 is, for example, a plurality of liquid crystal panels 1A. As illustrated in FIGS. 6 and 7, the optical element 1 includes, for example, a first liquid crystal panel 10, a second liquid crystal panel 20, a third liquid crystal panel 30, and a fourth liquid crystal panel 40. Specifically, the first liquid crystal panel 10, the second liquid crystal panel 20, the third liquid crystal panel 30, and the fourth liquid crystal panel 40 are stacked in order of proximity to the LED 110 in the axial direction. In other words, the first liquid crystal panel 10, the second liquid crystal panel 20, the third liquid crystal panel 30, and the fourth liquid crystal panel 40 are stacked in order from a Z2 side to a Z1 side. Specifically, as illustrated in FIGS. 3 and 4, one liquid crystal panel is attached on the back side of a frame 50 that is formed in a ring shape (annular shape), and four sets of the frame 50 and the one liquid crystal panel are stacked in the Z direction (axial direction). In this configuration, the liquid crystal panels adjacent to each other in the axial direction are bonded to each other with a bonding layer 57 therebetween as illustrated in FIGS. 6 and 7. The bonding layer 57 is a light-transmitting functional film with double-sided adhesion, such as optical clear adhesive (OCA). Each frame 50 is fixed to the inner periphery of the holding member 2. In other words, each liquid crystal panel 1A is fixed to the holding member 2 with the corresponding frame 50. A tubular member 52 is attached to the frame 50. The flexible printed circuit boards 200 include four flexible printed circuit boards 201A, 202A, 203A, and 204A. As illustrated in FIGS. 6 and 7, the flexible printed circuit board 201A is joined to the first liquid crystal panel 10, the flexible printed circuit board 202A is joined to the second liquid crystal panel 20, the flexible printed circuit board 203A is joined to the third liquid crystal panel 30, and the flexible printed circuit board 204A is joined to the fourth liquid crystal panel 40. The flexible printed circuit boards 201A and 203A extend in the same direction, and the flexible printed circuit boards 202A and 204A extend in the same direction. The flexible printed circuit boards 201A and 203A and the flexible printed circuit boards 202A and 204A extend in opposite directions.

Figure 18:
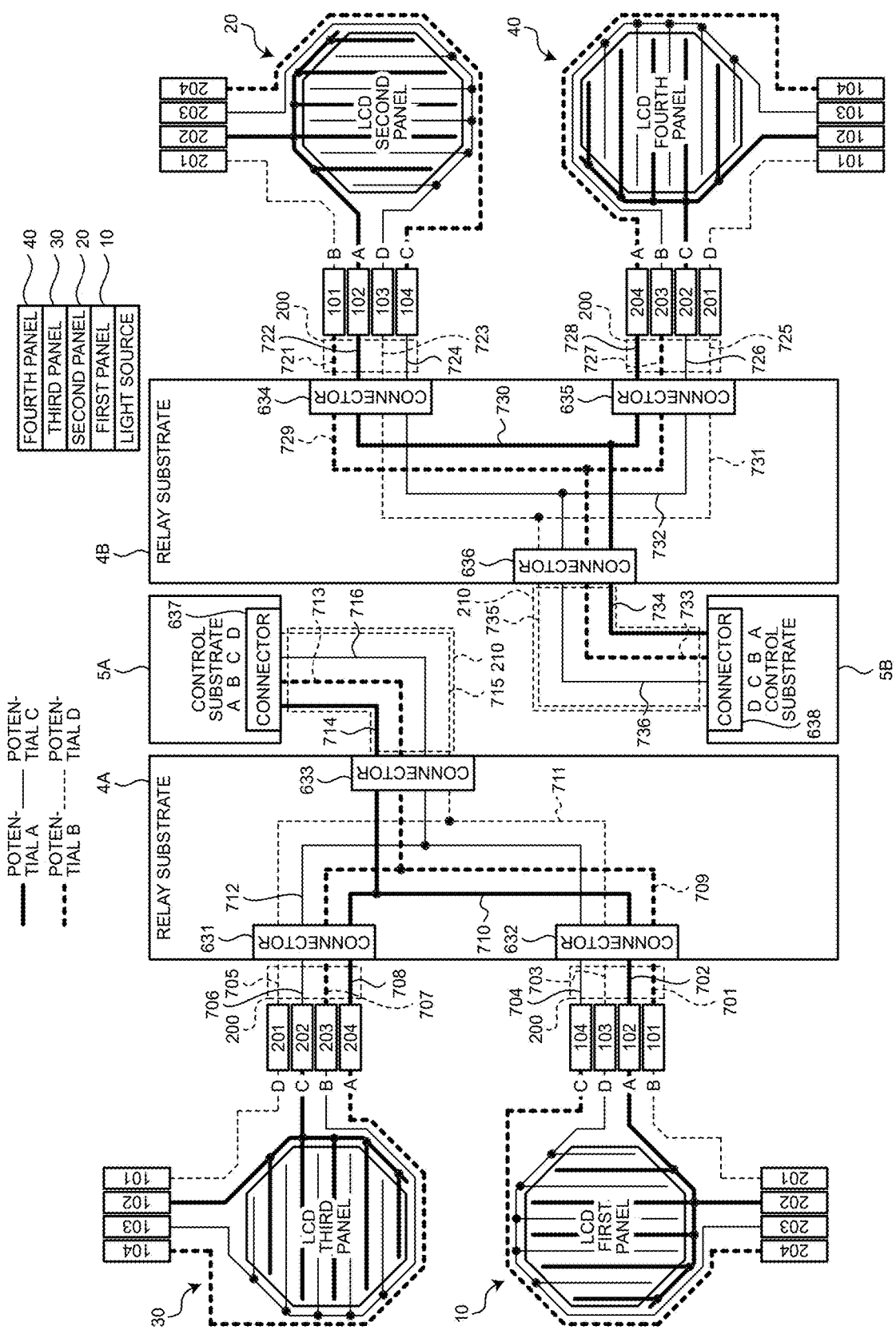
FIG. 18 is a schematic diagram illustrating the entire configuration of the liquid crystal panels, the relay substrates, and control substrates according to the first embodiment.

As illustrated in FIGS. 1 and 2, the relay substrates 4 are attached to the outer periphery of the tubular member 52. In other words, the relay substrates 4 are fixed to the holding member 2 with the tubular member 52 and the frames 50. As illustrated in FIG. 2, the relay substrates 4 include two relay substrates 4A and 4B. The relay substrate 4B includes a substrate body 44 and connectors 634, 635, and 636 (refer to FIG. 18). The connectors 634 (42, refer to FIG. 3), 635 (43, refer to FIG. 3), and 636 (41, refer to FIG. 3) are provided on the substrate body 44. On the substrate body 44, the connector 636 is disposed closer to the held member 3, and the connectors 634 and 635 are disposed closer to the holding member 2. In other words, the connector 636 is disposed on the Z2 side on the substrate body 44, and the connectors 634 and 635 are disposed on the Z1 side on the substrate body 44. The wire harness 210 is coupled to the connector 636. The flexible printed circuit boards 200 are coupled to the connectors 634 and 635. The relay substrate 4A has the same configuration as the relay substrate 4B, and specific coupling thereof is illustrated in FIG. 18 to be described later.

As illustrated in FIG. 1, a heat sink 55 is attached to the inner periphery of the held member 3 with an attachment member 56 therebetween. The LED 110 is fixed to a surface of the heat sink 55 on the Z1 side. In other words, the LED 110 is fixed to the held member 3 with the heat sink 55 and the attachment member 56 therebetween.

As illustrated in FIGS. 1 and 2, the control substrates 5 are attached to the inner periphery of the held member 3. The control substrates 5 control the liquid crystal panels 1A.

As illustrated in FIGS. 1 and 2, the flexible printed circuit boards 200 electrically couple the liquid crystal panels 1A and the relay substrates 4. The wire harnesses 210 electrically couple the relay substrates 4 and the control substrates 5. The flexible printed circuit boards 200 and the wire harnesses 210 extend in the axial direction (Z direction). The lengths of the flexible printed circuit boards 200 are shorter than the lengths of the wire harnesses 210. As described above, the holding member 2 rotates relative to the held member 3. The wire harnesses 210 are slack when the rotation angle of the holding member 2 relative to the held member 3 is 0°. The wire harnesses 210 are still slack and have excess length when the rotation angle of the holding member 2 relative to the held member 3 is 360° (in a state in which the holding member 2 has made one complete rotation relative to the held member 3).

Configuration of Liquid Crystal Panel

Figure 8:
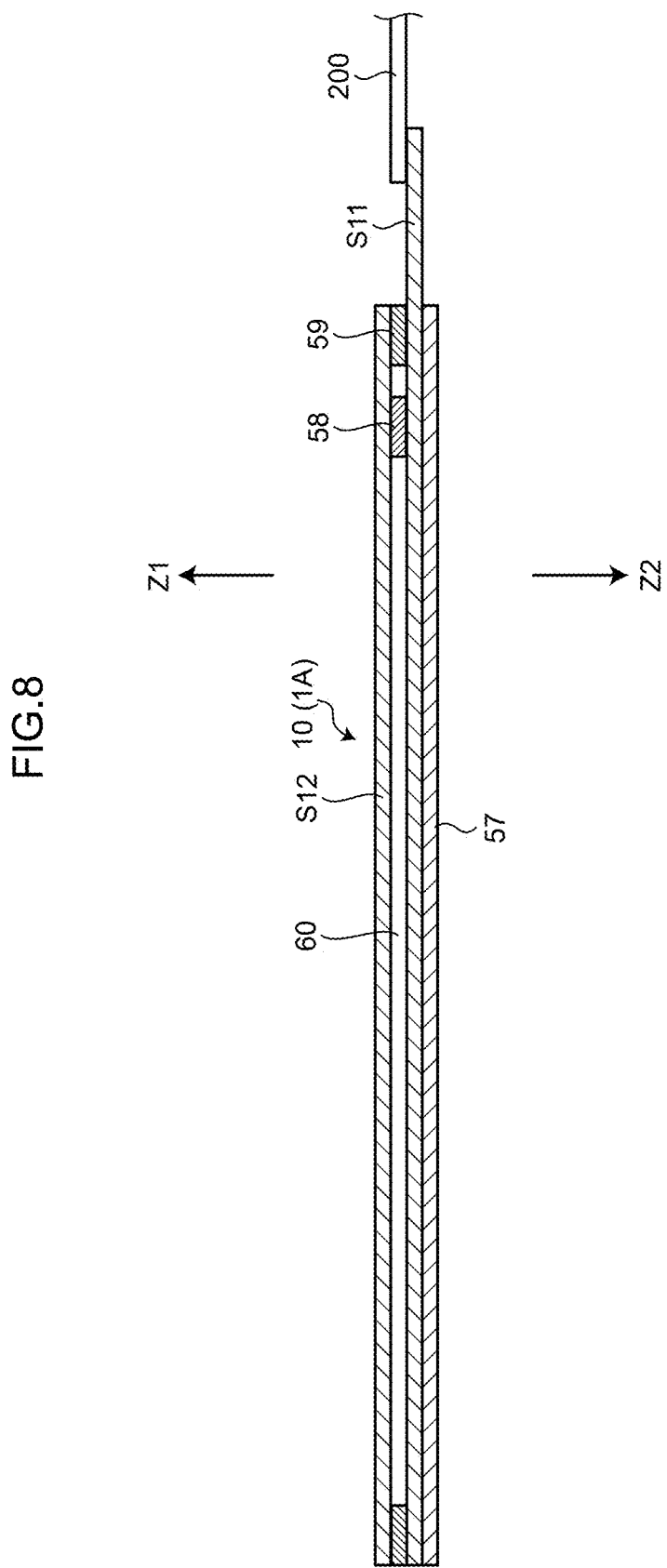
FIG. 8 is a sectional view of a liquid crystal panel.
Figure 9:
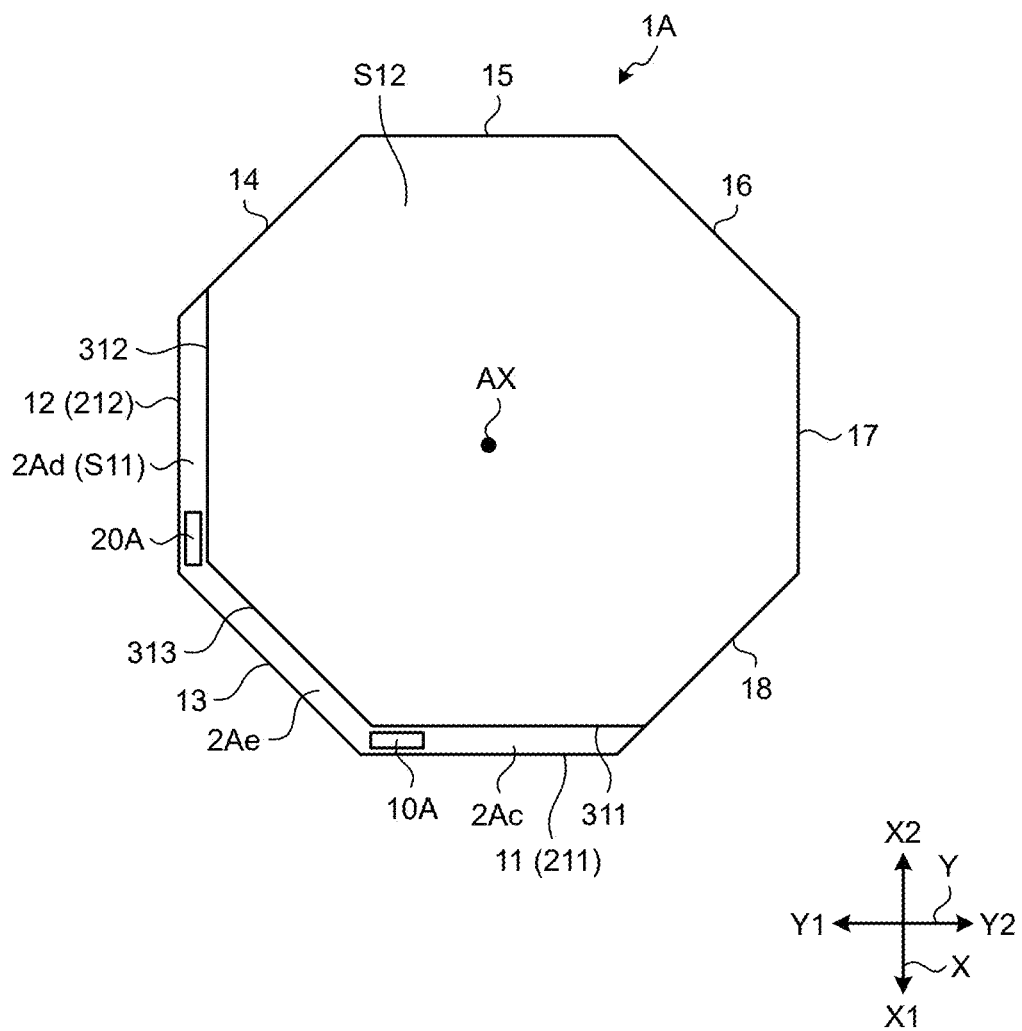
FIG. 9 is a schematic diagram of the liquid crystal panel when viewed from the front side.
Figure 10:
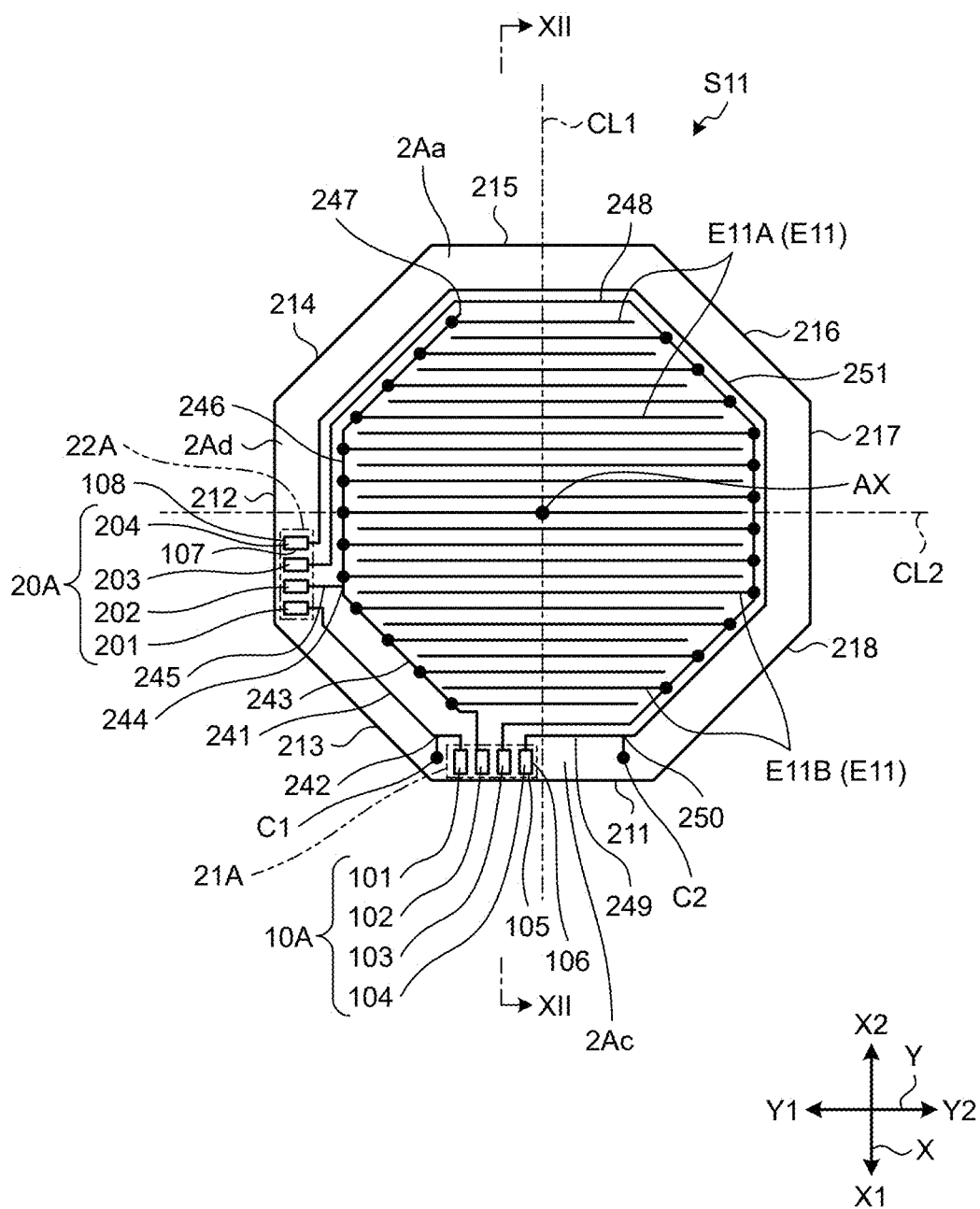
FIG. 10 is a schematic diagram illustrating the front surface of a first substrate included in the liquid crystal panel.
Figure 11:
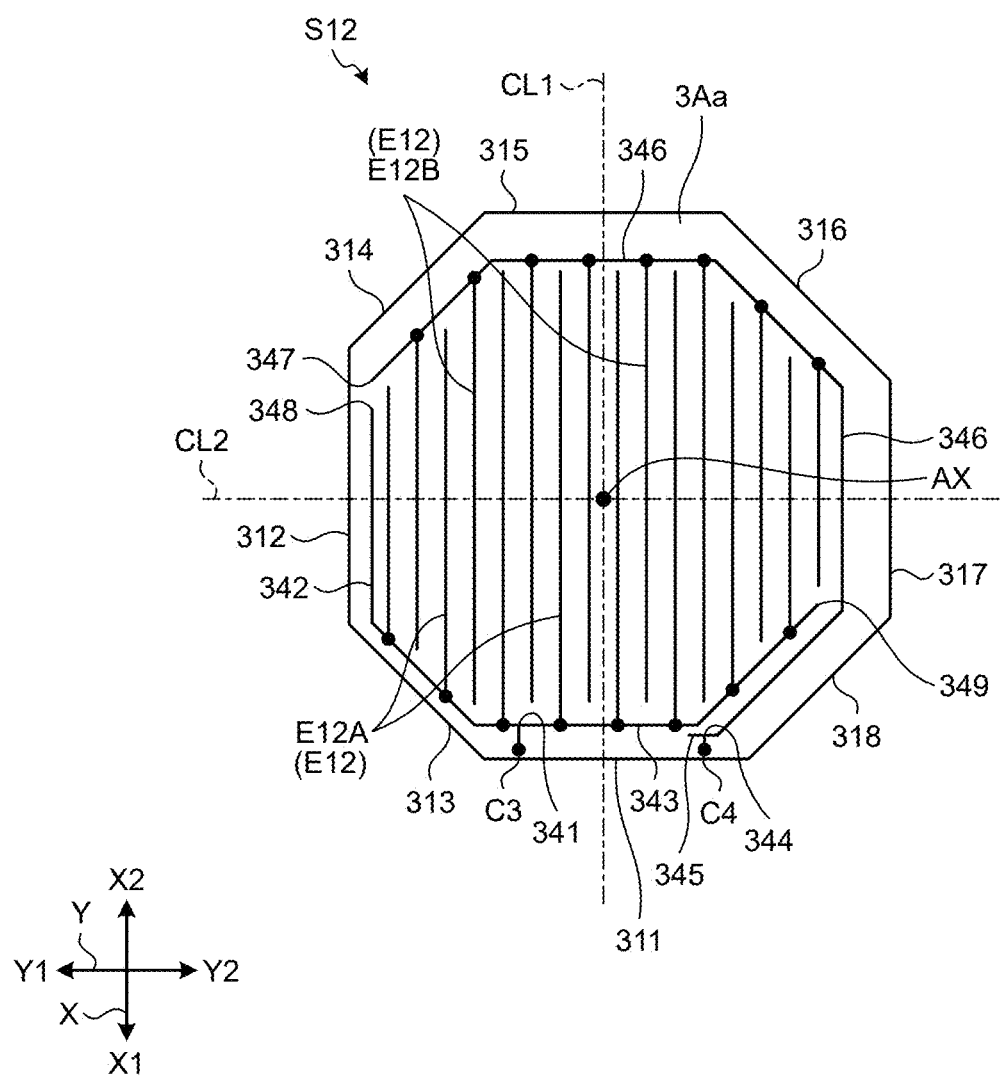
FIG. 11 is a schematic diagram illustrating the front surface of a second substrate included in the liquid crystal panel.

FIG. 8 is a sectional view of a liquid crystal panel. FIG. 9 is a schematic diagram of the liquid crystal panel when viewed from the front side. FIG. 10 is a schematic diagram illustrating the front surface of a first substrate included in the liquid crystal panel. FIG. 11 is a schematic diagram illustrating the front surface of a second substrate included in the liquid crystal panel. FIG. 12 is a sectional view along line XII-XII in FIG. 10.

As illustrated in FIG. 9, each liquid crystal panel 1A includes a first substrate S11, and a second substrate S12 disposed on the Z1 side of the first substrate S11. The liquid crystal panel 1A is a regular octagon in plan view and includes a first side 11, a second side 12, a third side 13, a fourth side 14, a fifth side 15, a sixth side 16, a seventh side 17, and an eighth side 18. In the present invention, the outer shape of the liquid crystal panel 1A is not particularly limited, and the examples of the shape also include a polygon other than an octagon as well as a circle and an ellipse. In the present embodiment, liquid crystal panels 1A stacked in the Z direction (axial direction) are the four liquid crystal panels 1A having the same configuration.

The first side 11 is positioned on the X1 side on the liquid crystal panel 1A. The first side 11 is parallel to the Y direction in the drawing. The first side 11 of the liquid crystal panel 1A coincides with a first side 211 of the first substrate S11 illustrated in FIG. 10. However, a first side 311 of the second substrate S12 illustrated in FIG. 11 is positioned on the X2 side of the first side 211 of the first substrate S11. Thus, as illustrated in FIG. 10, an end part 2Ac of the first substrate S11 on the X1 side is exposed when the second substrate S12 is stacked on the front side of the first substrate S11. A first terminal group 10A is provided at the end part 2Ac.

The second side 12 is positioned on the Y1 side on the liquid crystal panel 1A. The second side 12 is parallel to the X direction in the drawing. The second side 12 of the liquid crystal panel 1A coincides with a second side 212 of the first substrate S11 illustrated in FIG. 10. However, a second side 312 of the second substrate S12 illustrated in FIG. 11 is positioned on the Y2 side of the second side 212 of the first substrate S11. Thus, as illustrated in FIG. 9, an end part 2Ad of the first substrate S11 on the Y1 side is exposed when the second substrate S12 is stacked on the front side of the first substrate S11. A second terminal group 20A is provided at the end part 2Ad.

The third side 13 intersects both the X1 direction and the Y1 direction. The angle of the intersection is 45°. The third side 13 coincides with a third side 213 of the first substrate S11 illustrated in FIG. 10. However, a third side 313 of the second substrate S12 illustrated in FIG. 11 is positioned on the X2 and Y2 sides of the third side 213 of the first substrate S11. In other words, in plan view, the third side 313 of the second substrate S12 is positioned on the center side of the third side 213 of the first substrate S11. Thus, as illustrated in FIG. 9, an end part 2Ae of the first substrate S11 is exposed when the second substrate S12 is stacked on the front side of the first substrate S11.

The fourth side 14 intersects both the X2 direction and the Y1 direction. The angle of the intersection is 45°. The fourth side 14 coincides with a fourth side 214 of the first substrate S11 illustrated in FIG. 10 and a fourth side 314 of the second substrate S12 illustrated in FIG. 11.

The fifth side 15 is positioned on the X2 side on the liquid crystal panel 1A. The fifth side 15 coincides with a fifth side 215 of the first substrate S11 illustrated in FIG. 10 and a fifth side 315 of the second substrate S12 illustrated in FIG. 12.

The sixth side 16 intersects both the X2 direction and the Y2 direction. The angle of the intersection is 45°. The sixth side 16 coincides with a sixth side 216 of the first substrate S11 illustrated in FIG. 10 and a sixth side 316 of the second substrate S12 illustrated in FIG. 11.

The seventh side 17 is positioned on the Y2 side on the liquid crystal panel 1A. The seventh side 17 coincides with a seventh side 217 of the first substrate S11 illustrated in FIG. 10 and a seventh side 317 of the second substrate S12 illustrated in FIG. 11.

The eighth side 18 intersects both the X1 direction and the Y2 direction. The angle of the intersection is 45°. The eighth side 18 coincides with an eighth side 218 of the first substrate S11 illustrated in FIG. 10 and an eighth side 318 of the second substrate S12 illustrated in FIG. 11.

Accordingly, the area of the second substrate S12 is smaller than the area of the first substrate S11, and thus, the first terminal group 10A provided at the end part 2Ac of the first substrate S11 and the second terminal group 20A provided at the end part 2Ad thereof are exposed. The first terminal group 10A or the second terminal group 20A is electrically coupled to the corresponding flexible printed circuit board 200.

The following describes the first substrate S11 and the second substrate S12 with reference to FIGS. 10 and 11. FIG. 10 illustrates a center line CL1 extending in the X direction through the center of the first substrate S11 in the Y direction, and a center line CL2 extending in the Y direction through the center of the first substrate S11 in the X direction. The center line CL1 and the center line CL2 are illustrated in FIG. 11 as well.

As illustrated in FIG. 10, at the end part 2Ac along the first side 211 of the first substrate S11, the first terminal group 10A is provided at a first end part 21A (illustrated with dashed and double-dotted lines) on a side closer to the second side 212 (or side closer to the third side 213) with respect to the center of the first side 211. In other words, the end part 2Ac is an end part of the first substrate S11 on the X1 side, and the first end part 21A illustrated with dashed and double-dotted lines is disposed in a region of the end part 2Ac located on the Y1 side of the center line CL1. The first terminal group 10A is provided at the first end part 21A. As illustrated in FIG. 10, the first terminal group 10A includes a first terminal 101, a second terminal 102, a third terminal 103, and a fourth terminal 104. The first terminal 101, the second terminal 102, the third terminal 103, and the fourth terminal 104 are sequentially arranged in the Y direction from the Y1 side toward the Y2 side. The terminals 101, 102, 103, and 104 each have a pair of short sides 105 parallel to the first side 211 and a pair of long sides 106 parallel to the second side 212.

As illustrated in FIG. 10, at the end part 2Ad along the second side 212 of the first substrate S11, the second terminal group 20A is provided at a second end part 22A (illustrated with dashed and double-dotted lines) on a side closer to the first side 211 (or side closer to the third side 213) with respect to the center of the second side 212. In other words, the end part 2Ad is an end part of the first substrate S11 on the Y1 side, and the second end part 22A illustrated with dashed and double-dotted lines is disposed in a region of the end part 2Ad located on the X1 side of the center line CL2. The second terminal group 20A is provided at the second end part 22A. As illustrated in FIG. 10, the second terminal group 20A includes a fifth terminal 201, a sixth terminal 202, a seventh terminal 203, and an eighth terminal 204. The fifth terminal 201, the sixth terminal 202, the seventh terminal 203, and the eighth terminal 204 are sequentially arranged in the X direction from the X1 side toward the X2 side. The terminals 201, 202, 203, and 204 each have a pair of long sides 107 parallel to the first side 211 and a pair of short sides 108 parallel to the second side 212.

The following describes wires on the first substrate S11 and the second substrate S12. Wires are provided on the front surface of each substrate among the front and back surfaces thereof. In other words, a surface on which wires are provided is referred to as the front surface, and a surface opposite to the front surface is referred to as the back surface.

As illustrated in FIG. 10, wires, drive electrodes, and coupling portions are provided on a front surface 2Aa of the first substrate S11. A coupling portion C1 of the first substrate S11 and a coupling portion C3 of the second substrate S12 (refer to FIG. 11) are electrically coupled to each other through a conductive pole 58 (refer to FIG. 8) through which conduction is possible. Similarly, a coupling portion C2 of the first substrate S11 and a coupling portion C4 of the second substrate S12 (refer to FIG. 11) are electrically coupled to each other through a conductive pole 58 (refer to FIG. 8) through which conduction is possible.

The first terminal 101 and the fifth terminal 201 are electrically coupled to each other through a wire 241. A bifurcation point 242 is provided on the wire 241, and a wire extends from the bifurcation point 242 to a coupling point C1.

The second terminal 102 and the sixth terminal 202 are electrically coupled to each other through wires 243 and 245. A bifurcation point 244 is provided on the wire 243, and a wire 246 extends from the bifurcation point 244 to an end 247.

The third terminal 103 and the seventh terminal 203 are electrically coupled to each other through a wire 248. The fourth terminal 104 and the eighth terminal 204 are electrically coupled to each other through wires 249 and 251. The wire 249 extends to a bifurcation point 250 from the fourth terminal 104 toward the X2 side. The wire 251 extends from the bifurcation point 250 to the eighth terminal 204. A wire extends from the bifurcation point 250 to the coupling portion C2.

The following describes electrodes that drive a liquid crystal. Drive electrodes in the liquid crystal panel 1A include drive electrodes (first drive electrodes) E11 and drive electrodes (second drive electrodes) E12.

The drive electrodes E11 include drive electrodes E11A and drive electrodes E11B. The drive electrodes E12 include drive electrodes E12A and drive electrodes E12B.

The drive electrodes E11A are coupled to the wires 243 and 246. The drive electrodes E11A extend straight in the Y direction. The drive electrodes E11A are disposed at equal intervals in the X direction.

The drive electrodes E11B are coupled to the wire 248. The drive electrodes E11B extend straight in the Y direction. The drive electrodes E11B are disposed at equal intervals in the X direction. The drive electrodes E11A and E11B are alternately arranged in the X direction.

As illustrated in FIG. 11, wires, drive electrodes, and coupling portions are provided on a front surface 3Aa of the second substrate S12. The center lines CL1 and CL2 illustrated in FIG. 11 correspond to the center lines CL1 and CL2 illustrated in FIG. 10.

The coupling portion C3 is coupled to wires 342 and 343 through a bifurcation point 341. The wire 342 extends to an end 348. The wire 343 extends to an end 349. The coupling portion C4 is coupled to wires 345 and 346 through a bifurcation point 344. The wire 346 extends to an end 347.

The drive electrodes E12A are coupled to the wires 342 and 343. The drive electrodes E12A extend straight in the X direction. The drive electrodes E12A are disposed at equal intervals in the Y direction.

The drive electrodes E12B are coupled to the wire 346. The drive electrodes E12B extend straight in the X direction. The drive electrodes E12B are disposed at equal intervals in the Y direction. The drive electrodes E12A and E12B are alternately arranged in the Y direction.

The following briefly describes a sectional structure of each liquid crystal panel 1A. As illustrated in FIG. 12, the liquid crystal panel 1A includes the first substrate S11, the second substrate S12, and a liquid crystal layer LC1 (60). As illustrated in FIG. 12, the second substrate S12 is disposed on the front side (Z1 side) of the first substrate S11. The liquid crystal layer LC1 is provided between the second substrate S12 and the first substrate S11. Specifically, the front surface 2Aa of the first substrate S11 and the front surface 3Aa of the second substrate S12 face each other with the liquid crystal layer LC1 interposed therebetween. The first substrate S11 has a back surface 2Ab opposite to the front surface 2Aa, and the second substrate S12 has a back surface 3Ab opposite to the front surface 3Aa. Since the area of the second substrate S12 is smaller than the area of the first substrate S11 as described above, the third terminal 103 provided on the front surface 2Aa of the first substrate S11 is exposed. An insulating layer, which would typically be provided to prevent contact between two wires, is not provided in the liquid crystal panel 1A according to the present embodiment because there is no overlapping portions of wires on the first substrate S11.

In addition, as illustrated in FIG. 12, alignment films AL11 and AL12 are stacked on both substrates and the electrodes. Specifically, the alignment film AL11 is stacked on the front surface 2Aa of the first substrate S11 and the upper surfaces of the drive electrodes E11A and E11B, and part of the wire 248. The other alignment film AL12 is stacked on the front surface 3Aa of the second substrate S12 and the upper surfaces of the drive electrodes E12A. The first substrate S11 and the second substrate S12 are bonded to each other by a seal member 59 surrounding an effective region, and the liquid crystal layer LC1 fills a space formed by the seal member 59.

Rotation of Light Distribution Pattern

In the present embodiment, by rotating the four liquid crystal panels 1A about the center axis AX, it is possible to control the light distribution pattern such that the pattern has, for example, an elliptical shape with a long axis rotated by 45° relative to the X axis or the Y axis. Specific description is given below.

Figure 13:
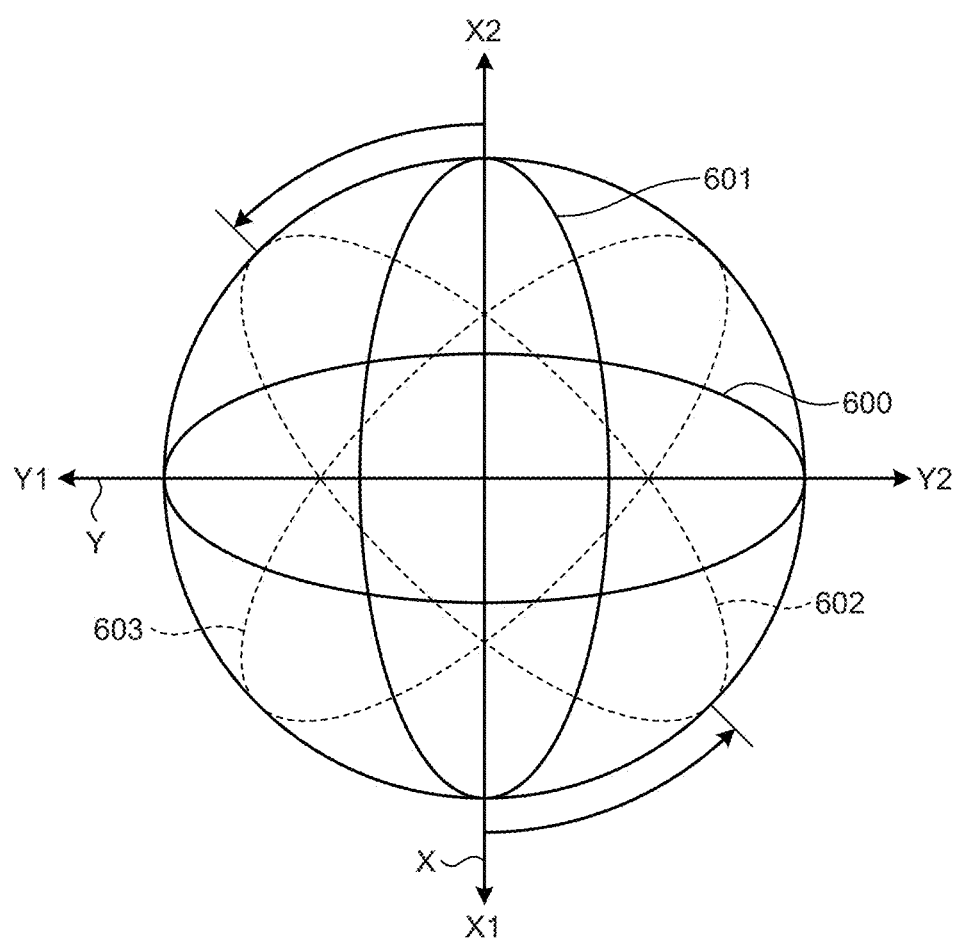
FIG. 13 is a schematic diagram illustrating an example in which a light distribution pattern rotates.

FIG. 13 is a schematic diagram illustrating an example in which an exemplary light distribution pattern rotates. A light distribution pattern 600 is the light distribution pattern having an elliptical shape with a long axis along the Y axis. This is, for example, the light distribution pattern when viewed from the Z1 side in a case where, in some or all of the four liquid crystal panels 1A, there is no potential difference between adjacent electrodes among a plurality of electrodes extending in the Y direction and arranged in the X direction but there is a potential difference between adjacent electrodes among a plurality of electrodes extending in the X direction and arranged in the Y direction. The ratio of the elliptical shape along the Y and X axes depends on the potential difference.

A light distribution pattern 601 is the light distribution pattern having an elliptical shape with a long axis along the X axis. This is, for example, the light distribution pattern when viewed from the Z1 side in a case where, in some or all of the four liquid crystal panels 1A, there is no potential difference between adjacent electrodes among a plurality of electrodes extending in the Y direction and arranged in the X direction but there is a potential difference between adjacent electrodes among a plurality of electrodes extending in the X direction and arranged in the Y direction. The ratio of the elliptical shape along the Y and X axes depends on the potential difference.

A light distribution pattern 602 is the light distribution pattern having an elliptical shape with a long axis tilted by 45° in the counterclockwise direction (leftward direction) relative to the X axis. This is obtained by, for example, rotating all the four liquid crystal panels 1A by 45° in the counterclockwise direction (leftward direction) about the center axis AX from the state of the light distribution pattern 601.

A light distribution pattern 603 is the light distribution pattern having an elliptical shape with a long axis tilted by 45° in the counterclockwise direction (leftward direction) relative to the Y axis. This is obtained by, for example, rotating all the four liquid crystal panels 1A in the counterclockwise direction (leftward direction) about the center axis AX by 45° from the state of the light distribution pattern 600.

The following describes operation modes for general light diffusion.

Light Diffusion in One Liquid Crystal Panel

Figure 14A:
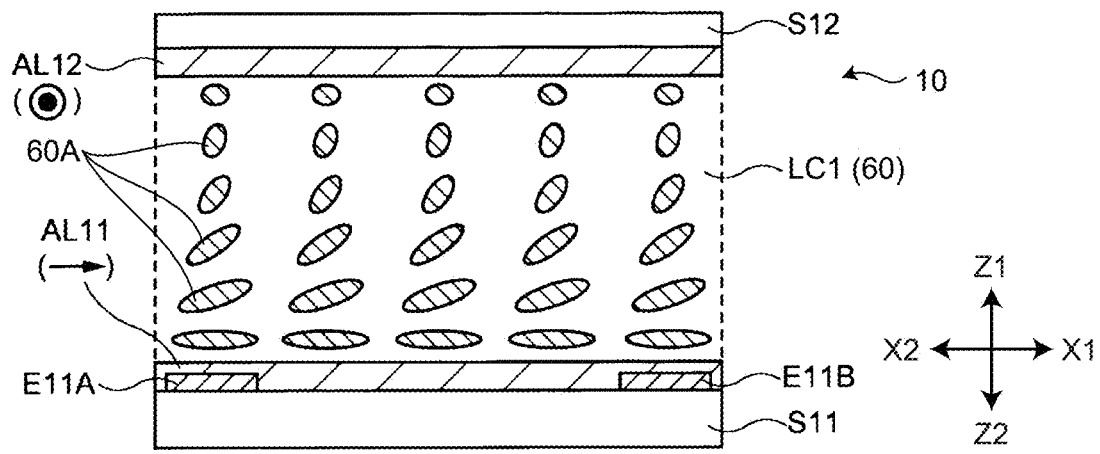
FIG. 14A is a sectional view of a liquid crystal panel, illustrating the alignment state of liquid crystal molecules when no voltage is applied to electrodes that drives a liquid crystal.
Figure 14B:
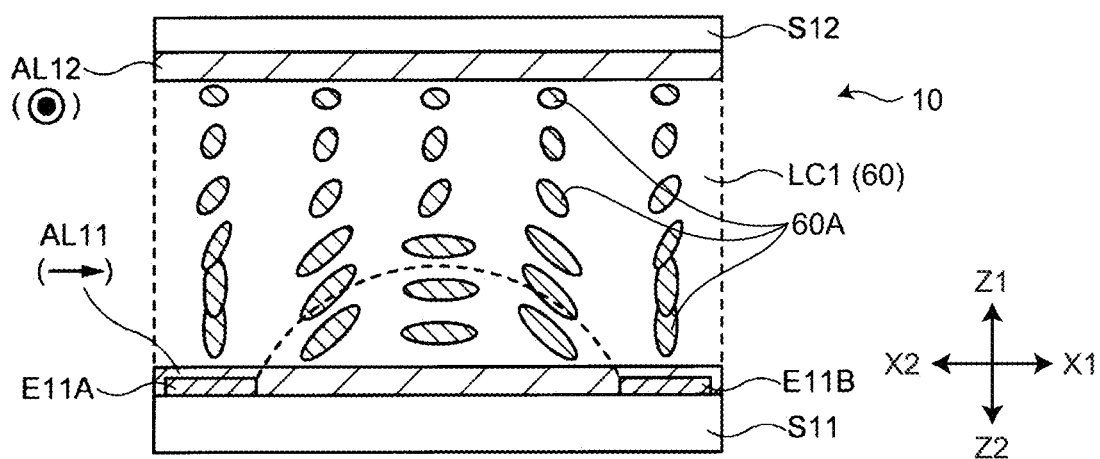
FIG. 14B is a sectional view of the liquid crystal panel, illustrating the alignment state of liquid crystal molecules when voltage is applied to the electrodes that drive the liquid crystal.
Figure 14C:
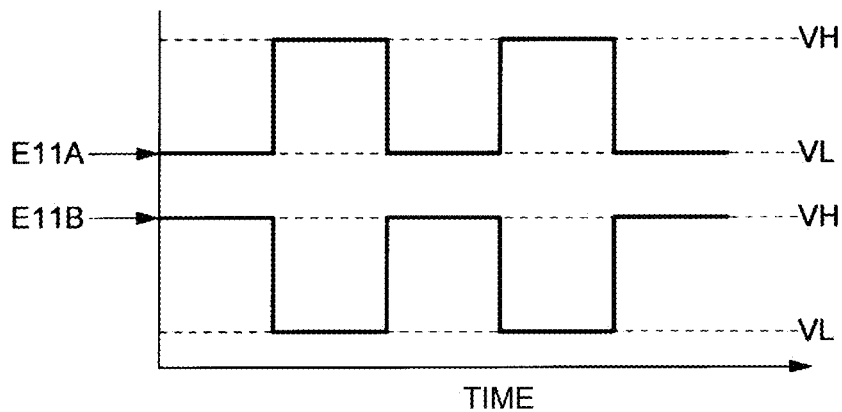
FIG. 14C is a diagram illustrating the waveform of a control signal applied to the electrodes that drive the liquid crystal.
Figure 15A:
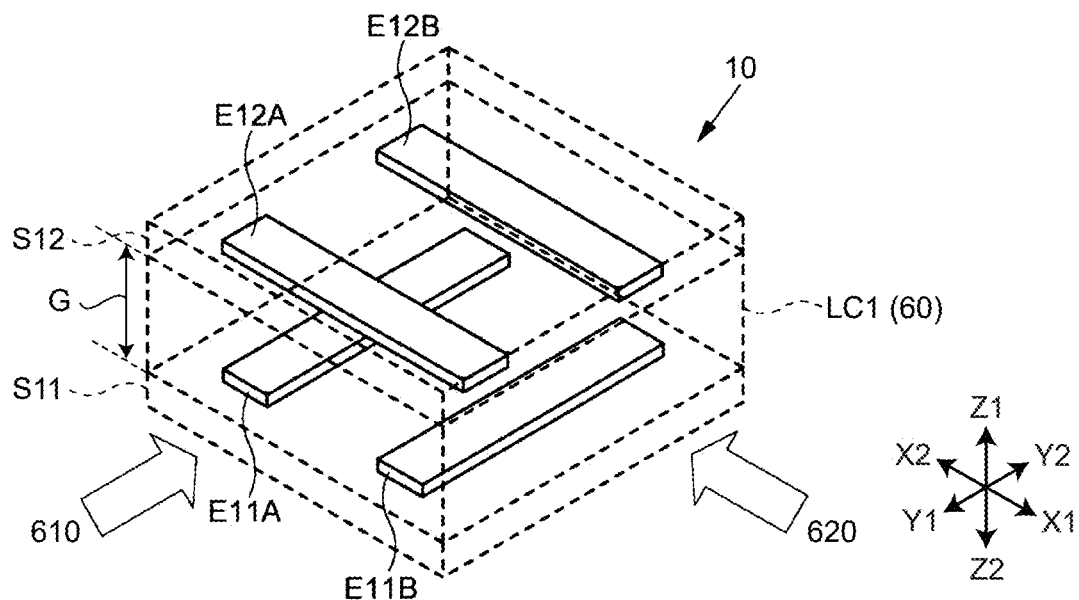
FIG. 15A is a schematic perspective view of the liquid crystal panel, illustrating an arrangement of first drive electrodes and second drive electrodes.
Figure 15B:
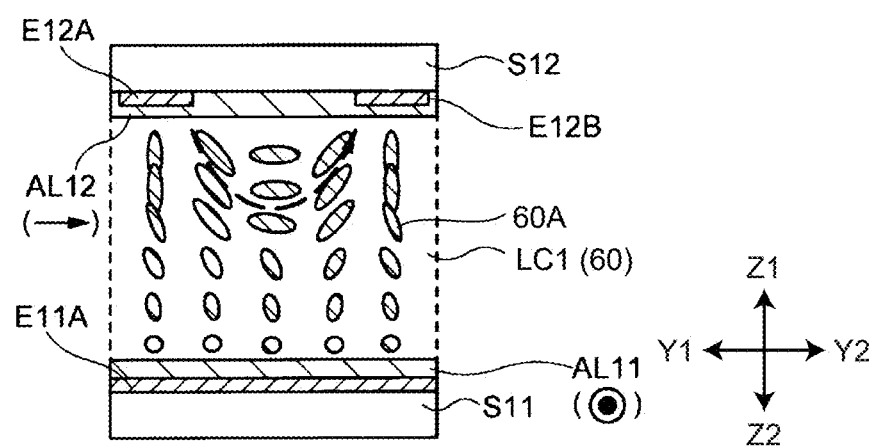
FIG. 15B is a schematic perspective view of the liquid crystal panel, illustrating the alignment state of liquid crystal molecules when voltage is applied to the second drive electrode.

FIG. 14A is a sectional view of a liquid crystal panel, illustrating the alignment state of liquid crystal molecules when no voltage is applied to the electrodes that drive the liquid crystal. FIG. 14B is a sectional view of the liquid crystal panel, illustrating the alignment state of liquid crystal molecules when voltage is applied to the electrodes that drive the liquid crystal. FIG. 14C is a diagram illustrating the waveform of a control signal applied to the electrodes that drive the liquid crystal. FIG. 15A is a schematic perspective view of the liquid crystal panel, illustrating an arrangement of the first drive electrodes and the second drive electrodes. FIG. 15B is a schematic perspective view of the liquid crystal panel, illustrating the alignment state of liquid crystal molecules when voltage is applied to the second drive electrodes. FIGS. 14A and 14B are views of the liquid crystal panel in the direction of arrow 610 in FIG. 15A, and FIG. 15B is a view of the liquid crystal panel in the direction of arrow 620 in FIG. 15A.

FIG. 14A illustrates a configuration in which the alignment treatment direction of the first alignment film AL11 and the alignment treatment direction of the second alignment film AL12 are different from each other in the first liquid crystal panel 10. Specifically, the first alignment film AL11 is provided with alignment treatment in the X direction, and the second alignment film AL12 is provided with alignment treatment in the Y direction. Thus, the alignment direction of the first alignment film AL11 and the alignment direction of the second alignment film AL12 are substantially orthogonal to each other. Accordingly, in the first liquid crystal panel 10, the initial light distribution direction on the first substrate S11 side is orthogonal to (intersects) the initial light distribution direction on the second substrate S12 side when viewed in the Z direction. The alignment treatment may be rubbing treatment of optical alignment treatment. The alignment direction of each alignment film may be set in the range of 90°±10° relative to the extending direction of the drive electrodes E11.

Since the alignment direction of the first alignment film AL11 and the alignment direction of the second alignment film AL12 are substantially orthogonal to each other, liquid crystal molecules 60A in the first liquid crystal layer LC1 are subjected to such alignment that the long-axis directions of the liquid crystal molecules 60A are twisted by 90° from the first alignment film AL11 to the second alignment film AL12 without receiving effects of external electric field. FIG. 14A illustrates a state in which no voltage is applied to the drive electrodes E11A and the drive electrodes E11B. Thus, as illustrated in FIG. 14A, the long-axis directions of the liquid crystal molecules 60A are twisted by 90° from the first alignment film AL11 to the second alignment film AL12.

FIG. 14A illustrates an example in which a positive-type twisted nematic liquid crystal (TN liquid crystal) is used as the first liquid crystal layer LC1 and the long axes of the liquid crystal molecules 60A are aligned in the same direction as the alignment directions of the alignment films. The liquid crystal layer 60 preferably contains a chiral agent that applies twist to the liquid crystal molecules 60A.

As illustrated in FIG. 14C, a low-level voltage VL is applied to the drive electrodes E11A, and a high-level voltage VH is applied to the drive electrodes E11B. In other words, pulse voltages that have the same amplitude and have opposite polarities in the same duration are applied to the two drive electrodes E11A and E11B, respectively. In this state, as illustrated in FIG. 14B, a horizontal electric field is generated between the drive electrodes E11A and E11B. As illustrated in FIG. 14B, the alignment directions of the liquid crystal molecules 60A on the first substrate S11 side change due to the horizontal electric field. For example, the alignment of the liquid crystal molecules 60A on the first substrate S11 side changes so that their long-axis direction aligned with a direction parallel to the direction of the electric field.

The values of the low-level voltage VL and the high-level voltage VH applied to the drive electrodes E11A and E11B are set as appropriate. For example, 0 V is applied as the low-level voltage VL1, and voltage of 5 V to 30 V is applied as the high-level voltage VH1. Voltage that is alternately switched to the low-level voltage VL and the high-level voltage VH periodically is applied to the drive electrodes E11A and E11B (refer to FIG. 14C).

An alternating electric field can be generated by alternately applying the low-level voltage VL and the high-level voltage VH to the drive electrodes E11A and the drive electrodes E11B adjacent to each other on the same substrate, thereby preventing deterioration of the first liquid crystal layer LC1. The frequency of voltage applied to the drive electrodes E11A and E11B may be a frequency at which liquid crystal molecules can respond to electric field change, and may be, for example, 15 Hz to 100 Hz.

It is known that the refractive index of a liquid crystal changes with the alignment state. As illustrated in FIG. 14A, in an OFF state in which no electric field is applied to the first liquid crystal layer LC1, the long-axis directions of the liquid crystal molecules 60A are horizontally aligned along the front surface of each substrate and twisted by 90° from the first substrate S11 side to the second substrate S12 side.

The first liquid crystal layer LC1 in this alignment state has substantially uniform refractive index distribution. Thus, S-waves and P-waves, which are orthogonal to the S-waves, of light after entering the first liquid crystal panel 10 are optically rotated due to the initial alignment of the liquid crystal molecules 60A but pass through the first liquid crystal layer LC1 in the Z direction with little refraction (or scattering). The optical rotation refers to change in the polarization directions of the polarized components during passing through the liquid crystal layer 60, and in the following description, refers to change of the P-polarized component (P-waves) to the S-polarized component (S-waves) and change of the S-polarized component (S-waves) to the P-polarized component (P-waves) during passing through the liquid crystal layer 60 of each liquid crystal panel 1A.

As illustrated in FIG. 14B, in an ON state in which voltage is applied to the drive electrodes E11A and E11B and an electric field is formed, the long axes of the liquid crystal molecules are aligned with the electric field in a case where the first liquid crystal layer LC1 has positive dielectric anisotropy. As a result, as illustrated in FIG. 14B, for example, a region in which the liquid crystal molecules 60A are substantially vertically aligned above the drive electrodes E11A and E11B, a region in which the liquid crystal molecules 60A are obliquely aligned along with distribution of the electric field between the drive electrodes E11A and E11B, and a region that is separated from the drive electrodes E11A and E11B and in which the initial alignment state is maintained, are formed in the first liquid crystal layer LC1.

As illustrated in FIG. 14B, between the drive electrodes E11A and E11B, the long axes of the liquid crystal molecules 60A are aligned in a protruding arc shape along a direction in which an electric field is generated. Specifically, as illustrated in FIGS. 14A and 14B, the initial alignment direction of the liquid crystal molecules 60A are the same as the direction of a horizontal electric field generated between the drive electrodes E11A and E11B, and as schematically illustrated in FIG. 14B, the alignment directions of the liquid crystal molecules 60A positioned substantially at the center between the electrodes hardly change, whereas the liquid crystal molecules positioned closer to the electrodes with respect to the central part are each aligned with a tilt in the normal direction of the front surface of the first substrate S11 in accordance with strength distribution of the electric field. Accordingly, in view of the entire liquid crystal on the first substrate S11 side, the liquid crystal molecules 60A are aligned in an arc shape between the drive electrodes E11A and E11B.

As a result, dielectric constant distribution having an arc shape is formed in the first liquid crystal layer LC1, and incident light (polarized component parallel to the initial alignment direction of the liquid crystal molecules 60A) radially diffuses. As illustrated in FIG. 15B, the same phenomenon due to the drive electrodes E12A and E12B occurs on the second substrate S12 side, and a polarized component of incident light parallel to the initial alignment direction of the liquid crystal molecules 60A on the second substrate S12 side is radially diffused. Specifically, for example, when S-waves diffuse on the first substrate S11 side in the liquid crystal layer 60, P-waves diffuse on the second substrate S12 side in the liquid crystal layer 60. For example, when P-waves diffuse on the first substrate S11 side in the liquid crystal layer 60, S-waves diffuse on the second substrate S12 side in the liquid crystal layer 60.

In the present embodiment, the liquid crystal layer 60 is sufficiently thick, which is approximately 15 µm to 50 µm as a cell gap G between the substrates, and thus diffusion of different polarized components can be controlled independently on the first substrate S11 side and the second substrate S12 side, respectively. The liquid crystal molecules 60A have a refractive index anisotropy Δn, and thus the liquid crystal layer 60 in the ON state has a refractive index distribution or a retardation distribution in accordance with the alignment state of the liquid crystal molecules 60A. The retardation is expressed as Δn·d where d represents the thickness of the liquid crystal layer 60. In the ON state, S-waves or P-waves are scattered due to the refractive index distribution of the liquid crystal layer 60 when passing through the liquid crystal layer 60.

Light Diffusion in Two Stacked Liquid Crystal Panels

Figure 16:
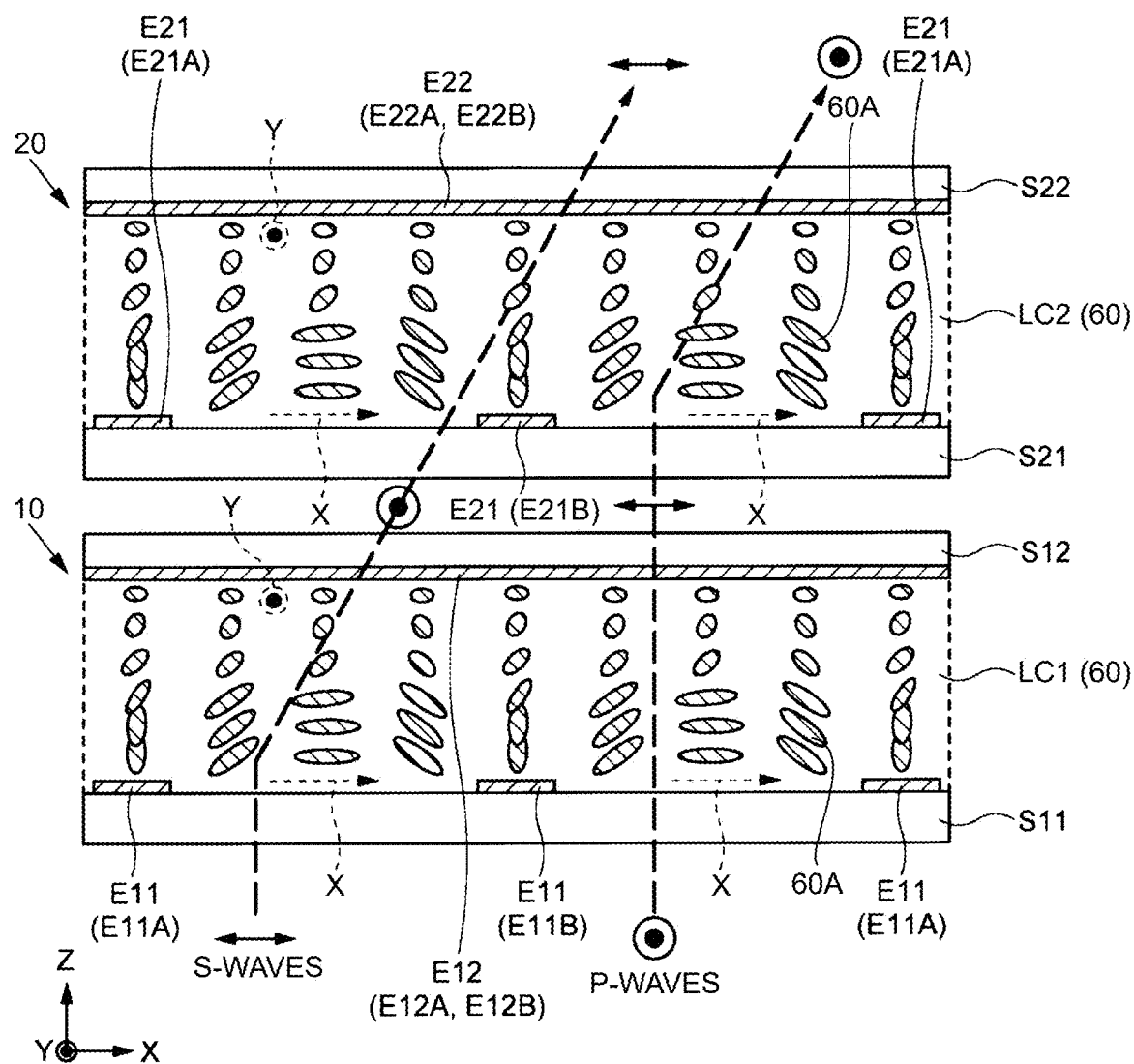
FIG. 16 is a diagram schematically illustrating a state in which P-waves and S-waves are diffused in a configuration in which a second liquid crystal panel is stacked on a first liquid crystal panel.

FIG. 16 is a diagram schematically illustrating a state in which P-waves and S-waves are diffused in a configuration in which the second liquid crystal panel is stacked on the first liquid crystal panel 10. Drive electrodes in the second liquid crystal panel 20 include drive electrodes (first drive electrodes) E21 and drive electrodes (second drive electrodes) E22. The drive electrodes E21 include drive electrodes E21A and drive electrodes E21B, and the drive electrodes E22 include drive electrodes E22A and drive electrodes E22B. The second liquid crystal panel 20 has the same configuration as the first liquid crystal panel 10 and is stacked on the first liquid crystal panel 10 without being rotated (at the rotation angle of 0° relative to the Z-axis direction). The second liquid crystal panel 20 may be stacked on the first liquid crystal panel 10 in a state of being rotated by 180° in the Z-axis direction.

As illustrated in FIG. 16, when S-waves parallel to the X axis enter the first liquid crystal panel 10, the S-waves are optically rotated while passing through the first liquid crystal layer LC1 and become a polarized component parallel to the Y axis on the second substrate S12 side. In other words, S-waves have a polarization axis in the X-axis direction on the first substrate S11 side, but the polarization axis gradually changes as it passes through the first liquid crystal layer LC1 in the Z direction, and accordingly, the S-waves become P-waves having a polarization axis in the Y-axis direction on the second substrate S12 side and exit from the second substrate S12 side. Thus, S-waves on the first substrate S11 side are optically rotated while passing through the liquid crystal layer 60, and as a result, become P-waves on the second substrate S12 side.

S-waves on the first substrate S11 side have a polarization axis parallel to the alignment direction of the liquid crystal molecules 60A in the first liquid crystal layer LC1 on the first substrate S11 side, and thus diffuse in the X-axis direction in accordance with change in the refractive index distribution of the liquid crystal molecules 60A. P-waves on the second substrate S12 side diffuse in the Y-axis direction in accordance with change in the refractive index distribution of the liquid crystal molecules 60A.

However, P-waves on the first substrate S11 side have a polarization axis orthogonal to the alignment direction of the liquid crystal molecules 60A on the first substrate S11 side in the first liquid crystal layer LC1, and thus are not affected by the refractive index distribution of the liquid crystal molecules 60A and pass through the liquid crystal layer without diffusion. S-waves on the second substrate S12 side are orthogonal to the alignment direction of the liquid crystal molecules 60A, and thus are not affected by the refractive index distribution of the liquid crystal molecules 60A and pass through the liquid crystal layer without diffusion. Accordingly, P-waves after entering the first liquid crystal panel 10 are optically rotated while passing through the first liquid crystal panel 10, and as a result, become S-waves and exit from the second substrate S12 without diffusion by the first liquid crystal layer LC1.

The initial light distribution direction on a first substrate S21 side in the second liquid crystal panel 20 is orthogonal to (intersects) the initial light distribution direction on a second substrate S22 side when viewed in the Z direction. The initial light distribution direction on the first substrate S21 side in the second liquid crystal panel 20 is the same as the initial light distribution direction on the first substrate S11 side in the first liquid crystal panel 10 when viewed in the Z direction.

A second liquid crystal layer LC2 of the second liquid crystal panel 20 has the same refractive index distribution as the first liquid crystal layer LC1 of the first liquid crystal panel 10. Therefore, the same phenomenon as in the first liquid crystal panel 10 basically occurs in the second liquid crystal panel 20 as well. However, since the initial polarization axes of S-waves and P-waves are interchanged as passing through the first liquid crystal panel 10, polarized components affected by refractive index distribution in the second liquid crystal layer LC2 are interchanged as well. Specifically, in the process of passing through the second liquid crystal panel 20, the polarization axis of the original S-waves changes from the Y axis to the X-axis direction again, but diffusion does not occur. In contrast, the polarization axis of the original P-waves changes from the X axis to the Y-axis direction again and diffusion occurs due to the refractive index distribution in the second liquid crystal layer LC2. Accordingly, the original S-waves diffuse in the first liquid crystal panel 10 but do not diffuse in the second liquid crystal panel 20. The original P-waves do not diffuse in the first liquid crystal panel 10 but diffuse in the second liquid crystal panel 20.

Light Diffusion in Four Stacked Liquid Crystal Panels

Figure 17:
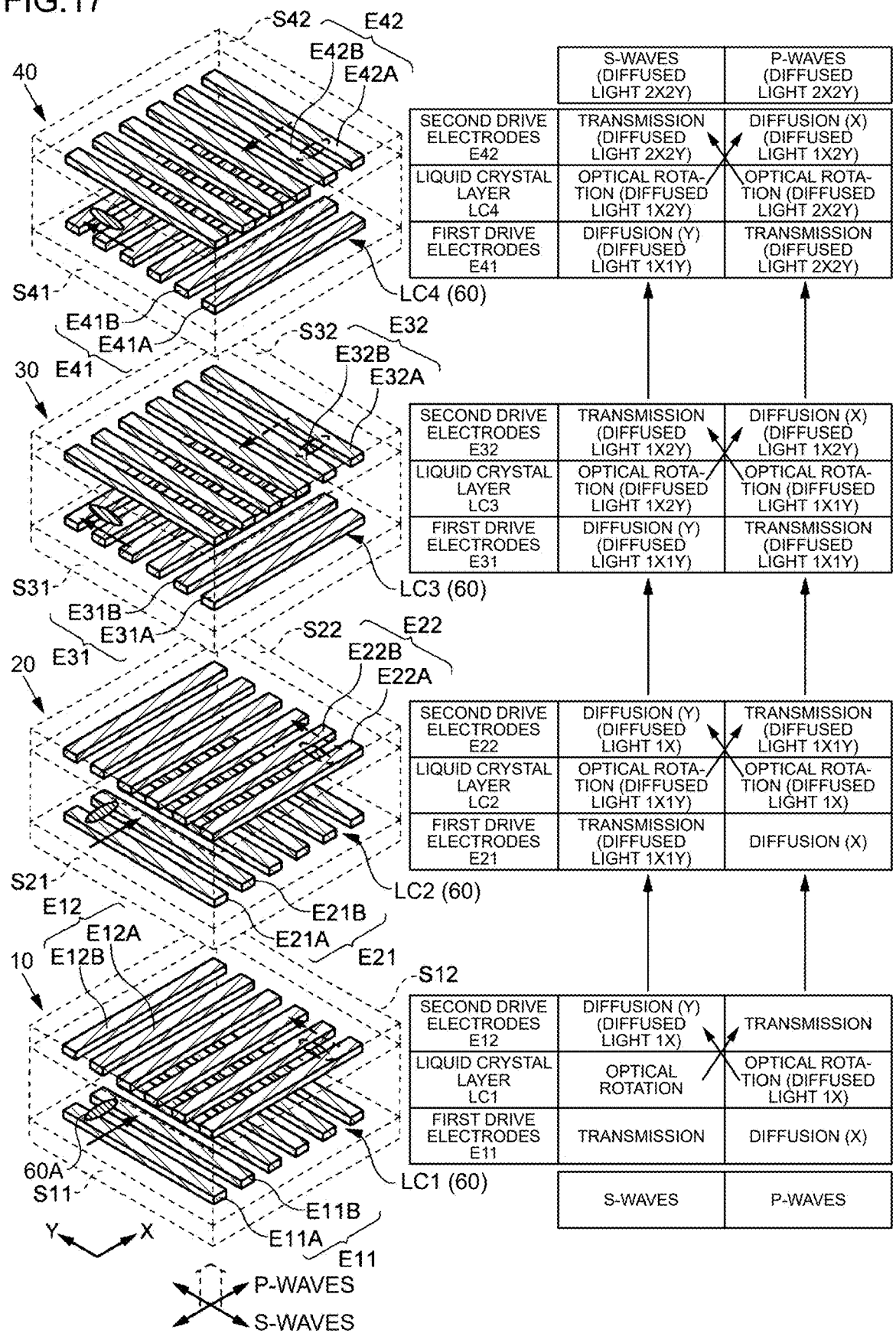
FIG. 17 is a schematic diagram for description of a state in which P-waves and S-waves are diffused by the four liquid crystal panels according to the first embodiment.

FIG. 17 is a schematic diagram for description of a state in which P-waves and S-waves are diffused by the four liquid crystal panels according to the first embodiment.

In FIG. 17, the third liquid crystal panel 30 and the fourth liquid crystal panel 40 are added to two of the first liquid crystal panel 10 and the second liquid crystal panel 20 illustrated in FIG. 16. Specifically, horizontal electric fields are formed on both the two drive electrode sides in each of the first liquid crystal panel 10, the second liquid crystal panel 20, the third liquid crystal panel 30, and the fourth liquid crystal panel 40. Drive electrodes in the third liquid crystal panel 30 include drive electrodes (first drive electrodes) E31 and drive electrodes (second drive electrodes) E32. The drive electrodes E31 include drive electrodes E31A and drive electrodes E31B, and the drive electrodes E32 include drive electrodes E32A and drive electrodes E32B. Drive electrodes in the fourth liquid crystal panel 40 include drive electrodes (first drive electrodes) E41 and drive electrodes (second drive electrodes) E42. The drive electrodes E41 include drive electrodes E41A and drive electrodes E41B, and the drive electrodes E42 include drive electrodes E42A and drive electrodes E42B.

The third liquid crystal panel 30 and the fourth liquid crystal panel 40 have the same configuration as the first liquid crystal panel 10 and are each stacked in a state of being rotated by 90° about the Z-axis direction with respect to the second liquid crystal panel 20. Any one or both of the third liquid crystal panel 30 and the fourth liquid crystal panel 40 may be stacked in a state of being rotated by 270° about the Z-axis direction with respect to the first liquid crystal panel 10.

The following description will be made with reference to FIG. 17. In the tables in FIG. 17, "(diffused light 1X)" indicates that the polarized components are diffused once in the X-axis direction until reaching this position, and "(diffused light 1X1Y)" indicates that the polarized components are diffused once in the X-axis direction and once in the Y-axis direction until reaching this position. The other notations have similar meanings.

The initial light distribution direction on a first substrate S31 side in the third liquid crystal panel 30 is orthogonal to (intersects) the initial light distribution direction on a second substrate S32 side when viewed in the Z direction. The initial light distribution direction on a first substrate S41 side in the fourth liquid crystal panel 40 is orthogonal to (intersects) the initial light distribution direction on a second substrate S42 side when viewed in the Z direction. The initial light distribution direction on the first substrate S31 side in the third liquid crystal panel 30 is the same as the initial light distribution direction on the first substrate S41 side in the fourth liquid crystal panel 40. The initial light distribution direction on the first substrate S31 side in the third liquid crystal panel 30 and the initial light distribution direction on the first substrate S41 side in the fourth liquid crystal panel 40 are orthogonal to (intersect) the initial light distribution direction on the first substrate S11 side in the first liquid crystal panel 10 and the initial light distribution direction on the first substrate S21 side in the second liquid crystal panel 20.

As described above, S-waves of incident light after entering the first liquid crystal panel 10 are optically rotated into P-waves once and then optically rotated into S-waves again, and also diffused once in each of the X-axis direction and the Y-axis direction in the second liquid crystal panel 20, between the time when the S-waves enter the first liquid crystal panel 10 and the time when they exit from the second liquid crystal panel 20.

P-waves of incident light after entering the first liquid crystal panel 10 are optically rotated into S-waves once and then optically rotated into P-waves again, and also diffused once in each of the X-axis direction and the Y-axis direction in the first liquid crystal panel 10, between the time when the P-waves enter the first liquid crystal panel 10 and the time when they exit from the second liquid crystal panel 20.

In the third liquid crystal panel 30, the longitudinal direction of the drive electrodes E31 intersects the drive electrodes E11 of the first liquid crystal panel 10 and the drive electrodes E21 of the second liquid crystal panel 20 at the angle of 90°±10°, and the longitudinal direction of the drive electrodes E32 intersects the drive electrodes E12 of the first liquid crystal panel 10 and the drive electrodes E22 of the second liquid crystal panel 20 at the angle of 90°±10°. Similarly, in the fourth liquid crystal panel 40, the longitudinal direction of the drive electrodes E41 intersects the drive electrodes E11 of the first liquid crystal panel 10 and the drive electrodes E21 of the second liquid crystal panel 20 at the angle of 90°±10°, and the longitudinal direction of the drive electrodes E42 intersects the drive electrodes E12 and the drive electrodes E22 at the angle of 90°±10°. Accordingly, for S-waves and P-waves, the phenomena in the third liquid crystal panel 30 and the fourth liquid crystal panel 40 are the reverse of the phenomena in the first liquid crystal panel 10 and the second liquid crystal panel 20.

S-Waves Entering Third Liquid Crystal Panel 30

Specifically, when S-waves after exiting from the second liquid crystal panel 20 (S-waves after entering the first liquid crystal panel 10) enter the third liquid crystal panel 30, the polarization direction of the S-waves becomes parallel to the long-axis directions of the liquid crystal molecules on the first substrate S31 side in a third liquid crystal layer LC3. Since the refractive index distribution of the liquid crystal molecules on the first substrate S31 side is changed by an electric field generated by the drive electrodes E31, the S-waves are diffused in the Y-axis direction. The diffused S-waves are optically rotated by 90° in accordance with the twisted alignment of the liquid crystal molecules while traveling through the third liquid crystal layer LC3 from the first substrate S31 side to the second substrate S32 side. Accordingly, the S-waves transition into P-waves again. The polarization direction of the P-waves is parallel to the long-axis directions of the liquid crystal molecules on the second substrate S32 side. Since the refractive index distribution of the liquid crystal molecules 60A on the second substrate S32 side is changed by an electric field generated by the drive electrodes E32, the P-waves are further diffused in the Y-axis direction due to the refractive index distribution of the liquid crystal molecules and exit thereafter. Thus, S-waves after entering the third liquid crystal panel 30 transition into P-waves and are again diffused once in each of the X-axis direction and the Y-axis direction while passing through the third liquid crystal panel 30.

The P-waves exit from the third liquid crystal panel 30 and enter the fourth liquid crystal panel 40. The polarization direction of the P-waves intersects the long-axis directions of the liquid crystal molecules 60A on the first substrate S41 side in a fourth liquid crystal layer LC4. Thus, although the refractive index distribution of the liquid crystal molecules 60A on the first substrate S41 side is changed by an electric field generated by a drive electrodes E41, the P-waves travel toward the second substrate S42 side without diffusion. The P-waves are optically rotated by 90° in accordance with the twisted alignment of the liquid crystal molecules 60A while traveling through the fourth liquid crystal layer LC4 from the first substrate S41 side to the second substrate S42 side. Accordingly, the P-waves transition into S-waves. The polarization direction of the S-waves intersects the long-axis directions of the liquid crystal molecules on the second substrate S42 side. Therefore, although the refractive index distribution of the liquid crystal molecules 60A on the second substrate S42 side is changed by an electric field generated by the drive electrodes E12, the S-waves pass through the liquid crystal panel as is without being affected by the change. Thus, while passing through the fourth liquid crystal panel 40, the P-waves transition into S-waves but are transmitted through the fourth liquid crystal panel 40 without diffusion or the like.

Thus, between the time when S-waves enter the third liquid crystal panel 30 and the time when they exit from the fourth liquid crystal panel 40, the S-waves transition into P-waves once and then transition into S-waves again, and are also diffused once in each of the X-axis direction and the Y-axis direction in the third liquid crystal panel 30.

P-Waves Entering Third Liquid Crystal Panel 30

The polarization direction of P-waves entering the third liquid crystal panel 30 intersects (is orthogonal to) the long-axis directions of the liquid crystal molecules 60A on the first substrate S31 side in the third liquid crystal layer LC3. Thus, although the refractive index distribution of the liquid crystal molecules 60A on the first substrate S31 side is changed by an electric field generated by the drive electrodes E31, the P-waves travel toward the second substrate S32 side without diffusion. The P-waves are optically rotated by 90° in accordance with the twisted alignment of the liquid crystal molecules 60A while traveling through the third liquid crystal layer LC3 from the first substrate S31 side to the second substrate S32 side. Accordingly, the P-waves transition into S-waves. The polarization direction of the S-waves intersects the long-axis directions of the liquid crystal molecules 60A on the second substrate S32 side. Therefore, although the refractive index distribution of the liquid crystal molecules 60A on the second substrate S32 side is changed by an electric field generated by the drive electrodes E32, the S-waves pass through the liquid crystal panel as is without being affected by the change. Thus, P-waves after entering the third liquid crystal panel 30 transition into S-waves while passing through the third liquid crystal panel 30 but are transmitted therethrough without diffusion.

When S-waves having passed through the third liquid crystal panel 30 enter the fourth liquid crystal panel 40, the polarization direction of the S-waves is parallel to the long-axis directions of the liquid crystal molecules 60A on the first substrate S41 side in the fourth liquid crystal layer LC4. Since the refractive index distribution of the liquid crystal molecules 60A on the first substrate S41 side in the fourth liquid crystal panel 40 is changed by an electric field generated by the drive electrodes E41, the S-waves are diffused in the X-axis direction. The diffused S-waves are optically rotated by 90° in accordance with the twisted alignment of the liquid crystal molecules 60A while traveling through the fourth liquid crystal layer LC4 from the first substrate S41 side to the second substrate S42 side. Accordingly, the S-waves transition into P-waves again. The polarization direction of the P-waves is parallel to the long-axis directions of the liquid crystal molecules 60A on the second substrate S42 side. Since the refractive index distribution of the liquid crystal molecules 60A on the second substrate S42 side is changed by an electric field generated by the drive electrodes E42, the P-waves are further diffused in the Y direction due to the refractive index distribution of the liquid crystal molecules 60A and exit from the second substrate S42 side.

Thus, between the time when P-waves enter the third liquid crystal panel 30 and the time when they exit from the fourth liquid crystal panel 40, the P-waves transition into S-waves once and then transition into P-waves again, and are also diffused once in each of the X-axis direction and the Y-axis direction in the fourth liquid crystal panel 40.

Summary of Diffusion of Light Passing Through from First Liquid Crystal Panel 10 to Fourth Liquid Crystal Panel 40

As described above, between the time when S-waves emitted from the LED 110 enter the first liquid crystal panel 10 and the time when they exit from the fourth liquid crystal panel 40, the S-waves are diffused twice in each of the X-axis direction and the Y-axis direction. Between the time when P-waves emitted from the LED 110 enter the first liquid crystal panel 10 and the time when they exit from the fourth liquid crystal panel 40, the P-waves are diffused twice in each of the X-axis direction and the Y-axis direction.

Entire Configuration of Illumination Device

Figure 19A:
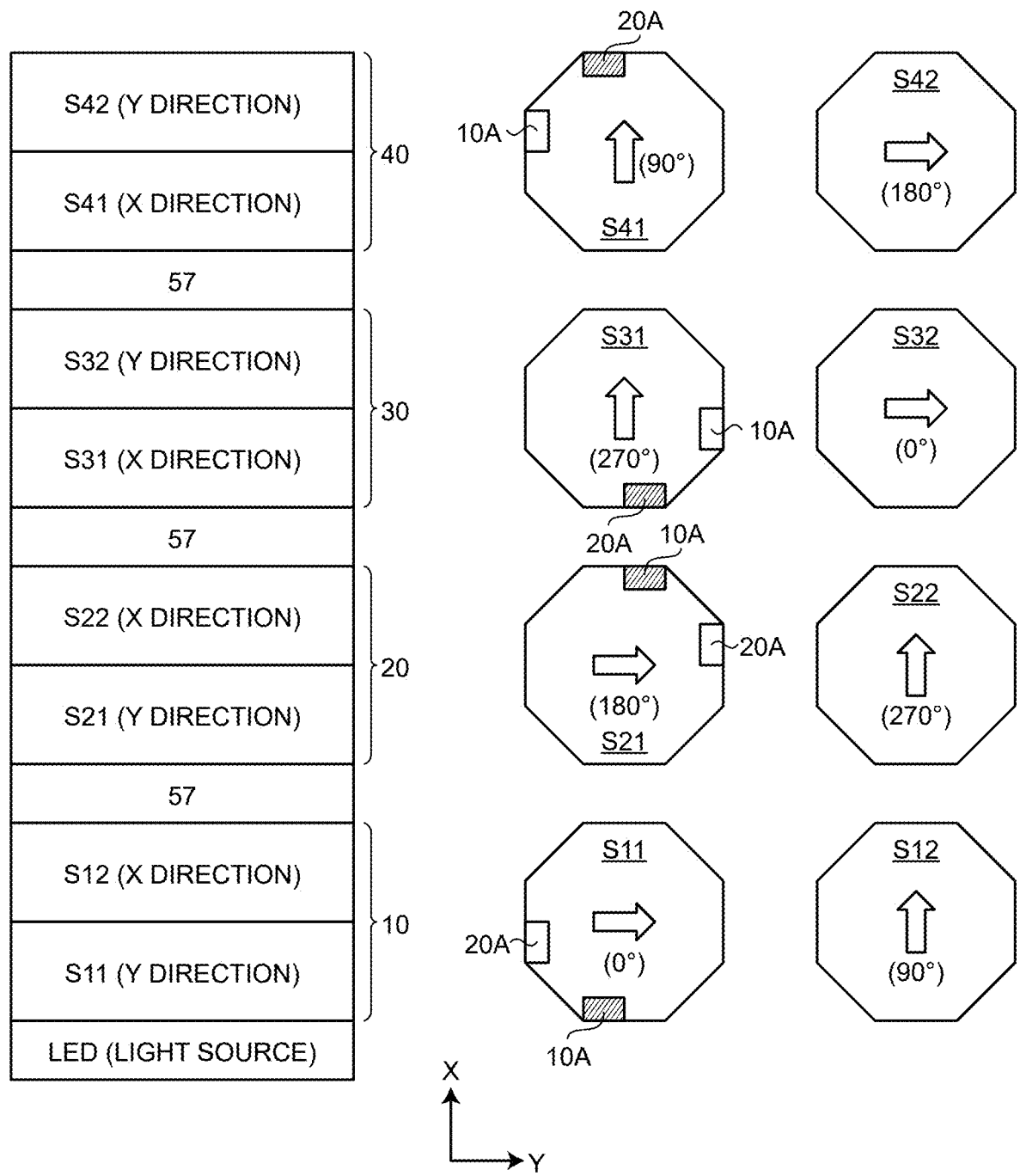
FIG. 19A is a schematic diagram illustrating an arrangement of the first substrate and the second substrate in each of the four liquid crystal panels.

FIG. 18 is a schematic diagram illustrating the entire configuration of the liquid crystal panels, the relay substrates, and the control substrates according to the first embodiment. FIG. 19A is a schematic diagram illustrating an arrangement of the first substrate and the second substrate in each of the four liquid crystal panels. FIG. 19B is a diagram for entire description of polarized waves subjected to action of each of the four liquid crystal panels, the diffusion direction of the polarized waves, and the potential of terminals.

As illustrated in FIG. 18, the configuration of the illumination device 100 according to the first embodiment includes the four liquid crystal panels 1A, the two relay substrates 4A and 4B, and two control substrates 5A and 5B. The control substrate 5A and the relay substrate 4A are electrically coupled to each other through one wire harness 210, and the wire harness 210 includes signal lines 713, 714, 715, and 716. The relay substrate 4A and the first liquid crystal panel 10 are electrically coupled to each other through one flexible printed circuit board 200, and the flexible printed circuit board 200 includes signal lines 701, 702, 703, and 704. The relay substrate 4A and the third liquid crystal panel 30 are electrically coupled to each other through one flexible printed circuit board 200, and the flexible printed circuit board 200 includes signal lines 705, 706, 707, and 708. The control substrate 5B and the relay substrate 4B are electrically coupled to each other through one wire harness 210, and the wire harness 210 includes signal lines 733, 734, 735, and 736. The relay substrate 4B and the second liquid crystal panel 20 are electrically coupled to each other through one flexible printed circuit board 200, and the flexible printed circuit board 200 includes signal lines 721, 722, 723, and 724. The relay substrate 4B and the fourth liquid crystal panel 40 are electrically coupled to each other through one flexible printed circuit board 200, and the flexible printed circuit board 200 includes signal lines 725, 726, 727, and 728.

As described above, the four liquid crystal panels 1A are the first liquid crystal panel 10, the second liquid crystal panel 20, the third liquid crystal panel 30, and the fourth liquid crystal panel 40. The first liquid crystal panel 10 and the third liquid crystal panel 30 are electrically coupled to the relay substrate 4A through the eight signal lines. The second liquid crystal panel 20 and the fourth liquid crystal panel 40 are electrically coupled to the relay substrate 4B through the eight signal lines. The relay substrate 4A and the control substrate 5A are electrically coupled to each other through the four signal lines. The relay substrate 4B and the control substrate 5B are electrically coupled to each other through the four signal lines. Detailed description thereof is given below. In FIG. 18, only the first substrate is illustrated for each liquid crystal panel, and illustration of the second substrate is omitted. However, as described above, drive electrodes are provided on the second substrate in a direction intersecting the direction of the drive electrodes on the first substrate.

As illustrated in FIG. 18, connectors 631, 632, and 633 are provided on the relay substrate 4A. As described above, the first liquid crystal panel 10 is provided with the first terminal 101 corresponding to the electrodes E12A of the second substrate, the second terminal 102 corresponding to the electrodes E11A of the first substrate, the third terminal 103 corresponding to the electrodes E11B of the first substrate, and the fourth terminal 104 corresponding to the electrodes E12B of the second substrate. The first terminal 101 and the connector 632 are coupled to each other through the signal line 701. The second terminal 102 and the connector 632 are coupled to each other through the signal line 702. The third terminal 103 and the connector 632 are coupled to each other through the signal line 703. The fourth terminal 104 and the connector 632 are coupled to each other through the signal line 704.

The third liquid crystal panel 30 is provided with the fifth terminal 201, the sixth terminal 202, the seventh terminal 203, and the eighth terminal 204. The fifth terminal 201 and the connector 631 are coupled to each other through the signal line 705. The sixth terminal 202 and the connector 631 are coupled to each other through the signal line 706. The seventh terminal 203 and the connector 631 are coupled to each other through the signal line 707. The eighth terminal 204 and the connector 631 are coupled to each other through the signal line 708.

The signal lines 701 and 707 are electrically coupled to the signal line 709 through the connectors 631 and 632. In other words, two signal lines are coupled to one signal line on the relay substrate 4A through the connectors 631 and 632. This is the same for the other signal lines: two signal lines are coupled to one signal line on the relay substrate 4A or 5B. Specifically, the signal lines 702 and 708 are electrically coupled to the signal line 710 through the connectors 631 and 632. The signal lines 703 and 705 are electrically coupled to the signal line 711 through the connectors 631 and 632. The signal lines 704 and 706 are electrically coupled to the signal line 712 through the connectors 631 and 632.

One signal line on the relay substrate 4A is electrically coupled to one signal line on the control substrate 5A through the connector 633. Specifically, the signal line 709 on the relay substrate 4A is electrically coupled to a connector 637 on the control substrate 5A through the signal line 713 of the corresponding wire harness 210. The signal line 710 on the relay substrate 4A is electrically coupled to the connector 637 on the control substrate 5A through the signal line 714 of the corresponding wire harness 210. The signal line 711 on the relay substrate 4A is electrically coupled to the connector 637 on the control substrate 5A through the signal line 715 of the corresponding wire harness 210. The signal line 712 on the relay substrate 4A is electrically coupled to the connector 637 on the control substrate 5A through the signal line 716 of the corresponding wire harness 210.

The following describes the potential of each signal line. The signal lines 702, 708, 710, and 714 have potential A. The signal lines 701, 707, 709, and 713 have potential B. The signal lines 704, 706, 712, and 716 have potential C. The signal lines 703, 705, 711, and 715 have potential D.

As illustrated in FIG. 18, the relay substrate 4B is provided with the connectors 634, 635, and 636. As described above, the second liquid crystal panel 20 is provided with the first terminal 101, the second terminal 102, the third terminal 103, and the fourth terminal 104. The first terminal 101 and the connector 634 are coupled to each other through the signal line 721. The second terminal 102 and the connector 634 are coupled to each other through the signal line 722. The third terminal 103 and the connector 634 are coupled to each other through the signal line 723. The fourth terminal 104 and the connector 634 are coupled to each other through the signal line 724.

The fourth liquid crystal panel 40 is provided with the fifth terminal 201, the sixth terminal 202, the seventh terminal 203, and the eighth terminal 204. The fifth terminal 201 and the connector 635 are coupled to each other through the signal line 725. The sixth terminal 202 and the connector 635 are coupled to each other through the signal line 726. The seventh terminal 203 and the connector 635 are coupled to each other through the signal line 727. The eighth terminal 204 and the connector 635 are coupled to each other through the signal line 728.

The signal lines 721 and 727 are electrically coupled to the signal line 729 through the connectors 634 and 635. In other words, two signal lines are coupled to one signal line through the connectors 634 and 635. This is the same for the other signal lines: two signal lines are coupled to one signal line. Specifically, the signal lines 722 and 728 are electrically coupled to the signal line 730 through the connectors 634 and 635. The signal lines 723 and 725 are electrically coupled to the signal line 731 through the connectors 634 and 635. The signal lines 724 and 726 are electrically coupled to the signal line 732 through the connectors 634 and 635.

One signal line on the relay substrate 4B is electrically coupled to one signal line on the control substrate 5B through the connector 636. Specifically, the signal line 729 on the relay substrate 4B is electrically coupled to the signal line 733 on the control substrate 5B. The signal line 730 on the relay substrate 4B is electrically coupled to the signal line 734 on the control substrate 5B. The signal line 731 on the relay substrate 4B is electrically coupled to the signal line 735 on the control substrate 5B. The signal line 732 on the relay substrate 4B is electrically coupled to the signal line 736 on the control substrate 5B.

The following describes the potential of each signal line. The signal lines 722, 728, 730, and 734 have potential A. The signal lines 721, 727, 729, and 733 have potential B. The signal lines 724, 726, 732, and 736 have potential C. The signal lines 723, 725, 731, and 735 have potential D.

As illustrated in FIG. 19A, in the illumination device 100, the first liquid crystal panel 10, the second liquid crystal panel 20, the third liquid crystal panel 30, and the fourth liquid crystal panel 40 are stacked in order of proximity to the LED 110.

In the first liquid crystal panel 10, the drive electrodes E11 on the first substrate S11 extend in the Y direction as illustrated with an outline arrow, and the drive electrodes E12 on the second substrate S12 extend in the X direction as illustrated with an outline arrow.

The second liquid crystal panel 20 is rotated relative to the first liquid crystal panel 10 by 180° in the clockwise direction (rightward direction) about the center axis AX (refer to FIG. 4). In the second liquid crystal panel 20, the drive electrodes E21 on the first substrate S21 extend in the Y direction as illustrated with an outline arrow, and the drive electrodes E22 on the second substrate S22 extend in the X direction as illustrated with an outline arrow.

The third liquid crystal panel 30 is rotated relative to the first liquid crystal panel 10 by 270° in the clockwise direction (rightward direction) about the center axis AX (refer to FIG. 4). In the third liquid crystal panel 30, the drive electrodes E31 on the first substrate S31 extend in the X direction as illustrated with an outline arrow, and the drive electrodes E32 on the second substrate S32 extend in the Y direction as illustrated with an outline arrow.

The fourth liquid crystal panel 40 is rotated relative to the first liquid crystal panel 10 by 90° in the clockwise direction (rightward direction) about the center axis AX (refer to FIG. 4). In the fourth liquid crystal panel 40, the drive electrodes E41 on the first substrate S41 extend in the X direction as illustrated with an outline arrow, and the drive electrodes E42 on the second substrate S42 extend in the Y direction as illustrated with an outline arrow.

The following describes the contents of FIG. 19B using the details of the first liquid crystal panel 10 as an example. For the terminal 101 of the first liquid crystal panel 10, "SUBSTRATE" is the second substrate. This means that, as described above with reference to FIGS. 10 and 11, the terminal 101 is electrically coupled from the coupling portion C1 of the first substrate S11 to the coupling portion C3 of the second substrate S12 (refer to FIG. 11) through the corresponding conductive pole 58 (refer to FIG. 8) and finally electrically coupled to the drive electrodes E12A on the second substrate S12. The X direction indicated as "ELECTRODE DIRECTION" means that the drive electrodes E12A extend in the X direction. Potential B indicated as "POTENTIAL" means that the potential of the terminal 101 of the first liquid crystal panel 10 is potential B as illustrated in FIG. 18. The Y direction indicated as "LIGHT DIFFUSION DIRECTION" means that S-waves (more specifically, S-waves into which incident P-waves are optically rotated) diffuse in the Y direction on the second substrate S12 side in the first liquid crystal panel 10 as described with reference to FIG. 17. This description is also applied to the other panels and substrates. As described later in detail with reference to FIGS. 22 and 24, "POLARIZED LIGHT SUBJECTED TO ACTION" means, among P-waves and S-waves, polarized waves that diffuse.

Light Distribution Patterns

Figure 20A:
FIG. 20A is a diagram illustrating the waveform of a control signal applied to the electrodes that drive the liquid crystal in a narrow light distribution pattern.
Figure 20B:
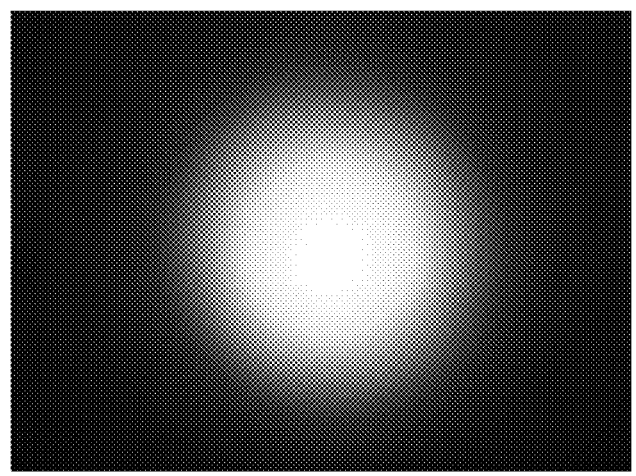
FIG. 20B is an image illustrating the narrow light distribution pattern.
Figure 21A:
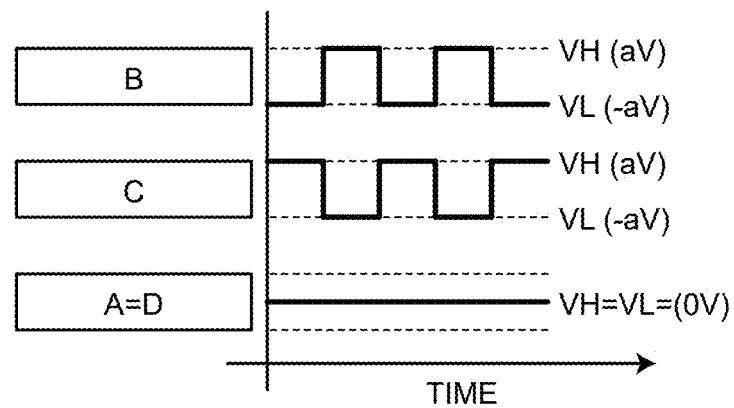
FIG. 21A is a diagram illustrating the waveforms of control signals applied to the electrodes that drive the liquid crystal in a horizontal line shaped light distribution pattern.
Figure 21B:
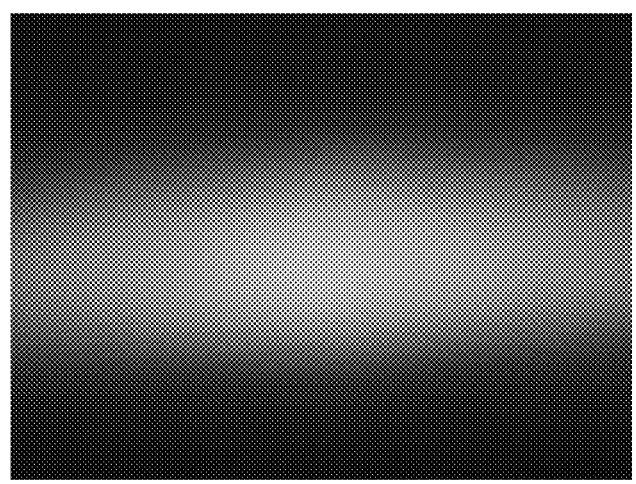
FIG. 21B is an image illustrating the horizontal line shaped light distribution pattern.
Figure 22:
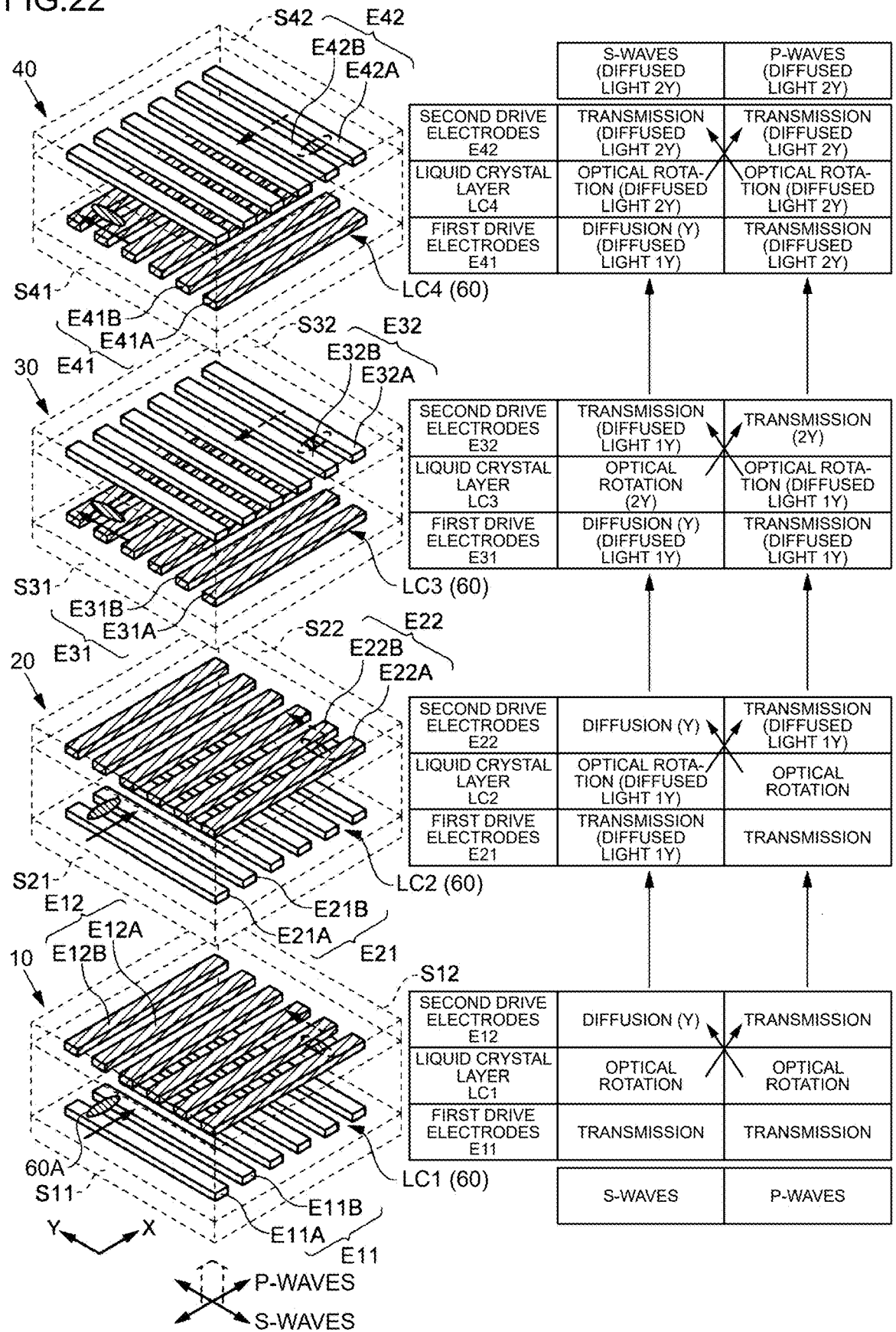
FIG. 22 is a schematic diagram for description of a state in which the horizontal line shaped light distribution pattern is formed by the four liquid crystal panels.
Figure 23A:
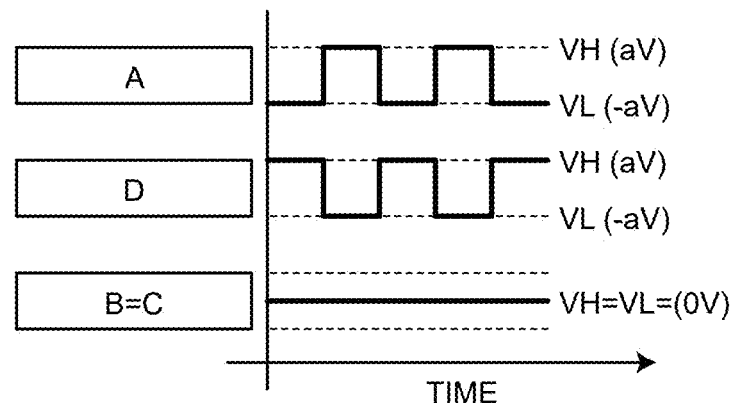
FIG. 23A is a diagram illustrating the waveforms of control signals applied to the electrodes that drive the liquid crystal in a vertical line shaped light distribution pattern.
Figure 23B:
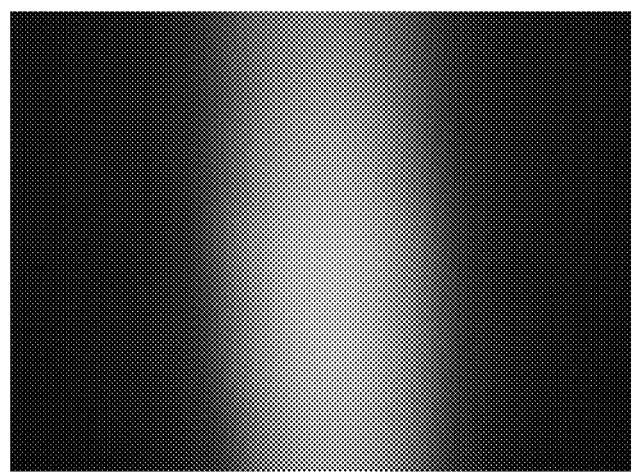
FIG. 23B is an image illustrating the vertical line shaped light distribution pattern.
Figure 24:
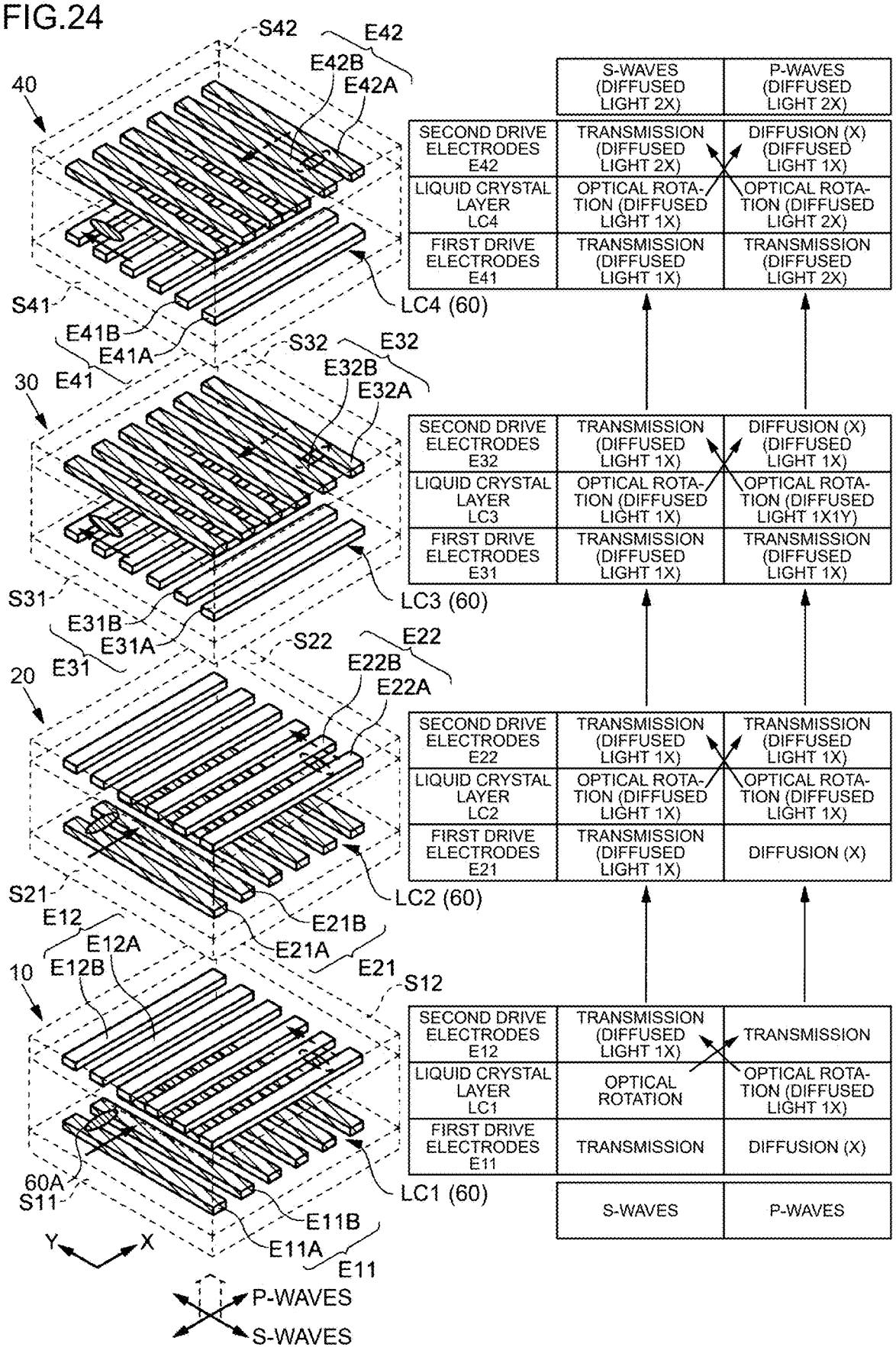
FIG. 24 is a schematic diagram for description of a state in which the vertical line shaped light distribution pattern is formed by the four liquid crystal panels.
Figure 25A:
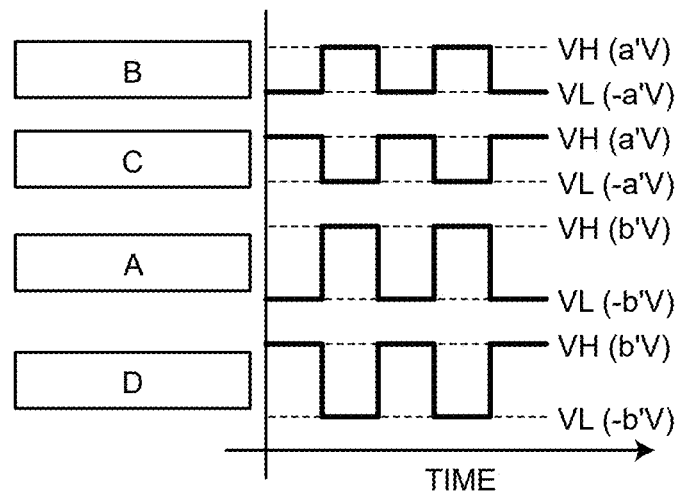
FIG. 25A is a diagram illustrating the waveforms of control signals applied to the electrodes that drive the liquid crystal in an elliptical light distribution pattern.
Figure 25B:
FIG. 25B is an image illustrating the elliptical light distribution pattern.
Figure 26A:
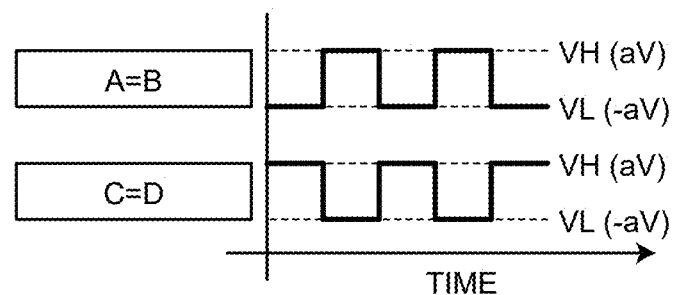
FIG. 26A is a diagram illustrating the waveforms of control signals applied to the electrodes that drive the liquid crystal in a circular light distribution pattern.
Figure 26B:
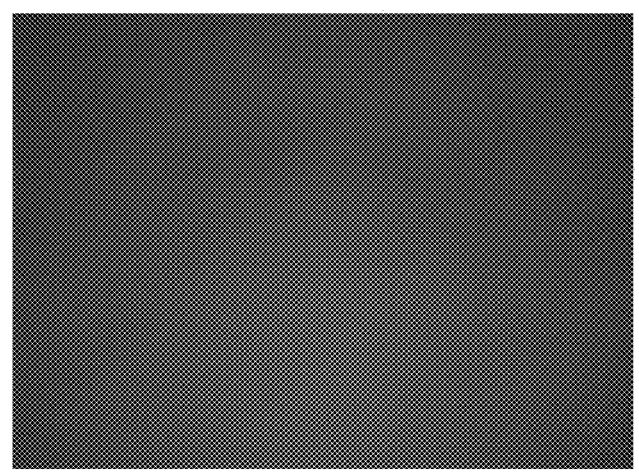
FIG. 26B is an image illustrating the circular light distribution pattern.

The following describes light distribution patterns. FIG. 20A is a diagram illustrating the waveform of a control signal applied to the electrodes that drive the liquid crystal in a narrow light distribution pattern. FIG. 20B is an image illustrating the narrow light distribution pattern. FIG. 21A is a diagram illustrating the waveforms of control signals applied to the electrodes that drive the liquid crystal in a horizontal line shaped light distribution pattern. FIG. 21B is an image illustrating the horizontal line shaped light distribution pattern. FIG. 22 is a schematic diagram for description of a state in which the horizontal line shaped light distribution pattern is formed by the four liquid crystal panels. FIG. 23A is a diagram illustrating the waveforms of control signals applied to the electrodes that drive the liquid crystal in a vertical line shaped light distribution pattern. FIG. 23B is an image illustrating the vertical line shaped light distribution pattern. FIG. 24 is a schematic diagram for description of a state in which the vertical line shaped light distribution pattern is formed by the four liquid crystal panels. FIG. 25A is a diagram illustrating the waveforms of control signals applied to the electrodes that drive the liquid crystal in an elliptical light distribution pattern. FIG. 25B is an image illustrating the elliptical light distribution pattern. FIG. 26A is a diagram illustrating the waveforms of control signals applied to the electrodes that drive the liquid crystal in a circular light distribution pattern. FIG. 26B is an image illustrating the circular light distribution pattern.

(1) Narrow Light Distribution Pattern

The following describes the narrow light distribution pattern with reference to FIGS. 20A and 20B. As illustrated in FIG. 20A, potentials A, B, C, and D are all 0 V. In other words, current flows to none of the drive electrodes on the four liquid crystal panels, and accordingly, the potentials are 0 V and no horizontal electric field is generated. Thus, among light entering the first liquid crystal panel 10 and exiting from the fourth liquid crystal panel 40, none of P-waves and S-waves diffuse. Accordingly, as illustrated in FIG. 20B, the light exits from the fourth liquid crystal panel 40 with the same light distribution pattern as the light enters the first liquid crystal panel 10.

(2) Horizontal Line Shaped Light Distribution Pattern

The horizontal line shaped light distribution pattern is a light distribution pattern having a linear shape extending long in the horizontal direction (in the present embodiment, the Y direction) (refer to FIG. 21B). As illustrated in FIG. 21A, the low-level voltage VL of potentials B and C is −a V and the high-level voltage VH thereof is a V. Potentials A and D are 0 V. In other words, potentials B and C are pulse voltages that have the first amplitude and have opposite polarities in the same duration. Accordingly, the pulse voltages are applied to the drive electrodes E12 of the first liquid crystal panel 10, the drive electrodes E31 of the third liquid crystal panel 30, the drive electrodes E22 of the second liquid crystal panel 20, and the drive electrodes E41 of the fourth liquid crystal panel 40.

Specifically, pulse voltages that have the first amplitude and have opposite polarities in the same duration are applied to the drive electrodes E12A and E12B. Pulse voltages that have the first amplitude and have opposite polarities in the same duration are applied to the drive electrodes E31A and E31B. Pulse voltages that have the first amplitude and have opposite polarities in the same duration are applied to the drive electrodes E22A and E22B. Pulse voltages that have the first amplitude and have opposite polarities in the same duration are applied to the drive electrodes E41A and E41B. Operation modes of light diffusion are as illustrated in FIG. 22. On the left side in FIG. 22, the drive electrodes that form an electric field are hatched.

As illustrated in FIG. 22, S-waves after entering the first liquid crystal panel 10 are not diffused while passing through the first liquid crystal panel 10 but are optically rotated into P-waves while passing through the first liquid crystal panel 10, and then exit from the first liquid crystal panel 10. The P-waves after entering the second liquid crystal panel 20 are optically rotated into S-waves while passing through the second liquid crystal panel 20, and diffused once in the Y direction on the second drive electrode side where a horizontal electric field is formed. The S-waves after entering the third liquid crystal panel 30 are diffused once in the Y direction on the first drive electrode side where a horizontal electric field is formed, and optically rotated into P-waves while passing through the third liquid crystal panel 30. The P-waves after entering the fourth liquid crystal panel 40 are not diffused but are optically rotated into S-waves while passing through the fourth liquid crystal panel 40.

P-waves after entering the first liquid crystal panel 10 are optically rotated into S-waves while passing through the first liquid crystal panel 10, diffused once in the Y direction on the second drive electrode side where a horizontal electric field is formed, and then exit from the first liquid crystal panel 10. The S-waves after entering the second liquid crystal panel 20 are optically rotated into P-waves while passing through the second liquid crystal panel 20, but not diffused while passing through the second liquid crystal panel 20. The P-waves after entering the third liquid crystal panel 30 are optically rotated into S-waves while passing through the third liquid crystal panel 30, but not diffused while passing through the third liquid crystal panel 30. The S-waves after entering the fourth liquid crystal panel 40 are diffused once in the Y direction on the first drive electrode side where a horizontal electric field is formed, and optically rotated into P-waves while passing through the fourth liquid crystal panel 40.

As described above, while passing through the first liquid crystal panel 10 to the fourth liquid crystal panel 40, S-waves are diffused twice in the Y direction and P-waves are diffused twice in the Y direction. In other words, S-waves and P-waves are diffused in the Y direction four times in total. Consequently, the horizontal line shaped light distribution pattern illustrated in FIG. 21B is formed as described above.

(3) Vertical Line Shaped Light Distribution Pattern

The vertical line shaped light distribution pattern is a light distribution pattern having a linear shape extending long in the vertical direction (in the present embodiment, the X direction) (refer to FIG. 23B). As illustrated in FIG. 23A, the low-level voltage VL of potentials A and D is −a V and the high-level voltage VH thereof is a V. Potentials B and C are 0 V. In other words, potentials A and D are pulse voltages that have the second amplitude and have opposite polarities in the same duration. Accordingly, the pulse voltages are applied to the drive electrodes E11 of the first liquid crystal panel 10, the drive electrodes E32 of the third liquid crystal panel 30, the drive electrodes E21 of the second liquid crystal panel 20, and the drive electrodes E42 of the fourth liquid crystal panel 40.

Specifically, pulse voltages that have the second amplitude and have opposite polarities in the same duration are applied the drive electrodes E11A and E11B. Pulse voltages that have the second amplitude and have opposite polarities in the same duration are applied to the drive electrodes E32A and E32B. Pulse voltages that have the second amplitude and have opposite polarities in the same duration are applied to the drive electrodes E21A and E21B. Pulse voltages that have the second amplitude and have opposite polarities in the same duration are applied to the drive electrodes E42A and E42B. Operation modes of light diffusion are as illustrated in FIG. 24. On the left side in FIG. 24, the drive electrodes that form an electric field are hatched.

As illustrated in FIG. 24, S-waves after entering the first liquid crystal panel 10 are not diffused while passing through the first liquid crystal panel 10 but optically rotated into P-waves while passing through the first liquid crystal panel 10, and then exit from the first liquid crystal panel 10. The P-waves after entering the second liquid crystal panel 20 are optically rotated into S-waves while passing through the second liquid crystal panel 20, and diffused once in the X direction on the first drive electrode side where a horizontal electric field is formed. The S-waves after entering the third liquid crystal panel 30 are diffused once in the X direction on the second drive electrode side where a horizontal electric field is formed, and optically rotated into P-waves while passing through the third liquid crystal panel 30. The P-waves after entering the fourth liquid crystal panel 40 are not diffused but are optically rotated into S-waves while passing through the fourth liquid crystal panel 40.

P-waves after entering the first liquid crystal panel 10 are optically rotated into S-waves while passing through the first liquid crystal panel 10, diffused once in the X direction on the first drive electrode side where a horizontal electric field is formed, and then exit from the first liquid crystal panel 10. The S-waves after entering the second liquid crystal panel 20 are optically rotated into P-waves while passing through the second liquid crystal panel 20, but not diffused while passing through the second liquid crystal panel 20. The P-waves after entering the third liquid crystal panel 30 are optically rotated into S-waves while passing through the third liquid crystal panel 30, but not diffused while passing through the third liquid crystal panel 30. The S-waves after entering the fourth liquid crystal panel 40 are diffused once in the X direction on the second drive electrode side where a horizontal electric field is formed, and optically rotated into P-waves while passing through the fourth liquid crystal panel 40.

As described above, while passing through the first liquid crystal panel 10 to the fourth liquid crystal panel 40, S-waves are diffused twice in the X direction and P-waves are diffused twice in the X direction. In other words, S-waves and P-waves are diffused in the X direction four times in total. Consequently, the vertical line shaped light distribution pattern illustrated in FIG. 23B is formed as described above.

(4) Elliptical Light Distribution Pattern of Ellipse

The elliptical light distribution pattern is a light distribution pattern having a vertically long ellipse shape as illustrated in FIG. 25B, for example. As illustrated in FIG. 25A, the low-level voltage VL of potentials B and C is −a' V and the high-level voltage VH thereof is a' V. The low-level voltage VL of potentials A and D is −b' V and the high-level voltage VH thereof is b' V. The voltage a' V is smaller than the voltage b' V. The voltage −a' V is larger than the voltage −b' V.

In other words, potentials B and C are pulse voltages that have the third amplitude and have opposite polarities in the same duration. Specifically, the second drive electrodes E12 of the first liquid crystal panel 10, the first drive electrodes E31 of the third liquid crystal panel 30, the drive electrodes E22 of the second liquid crystal panel 20, and the drive electrodes E41 of the fourth liquid crystal panel 40 each include two drive electrodes alternately arranged when viewed in the Z direction, and pulse voltages that have the third amplitude and have opposite polarities in the same duration are applied to the two drive electrodes, respectively.

Specifically, pulse voltages that have the third amplitude and have opposite polarities in the same duration are applied to the drive electrodes E12A and E12B. Pulse voltages that have the third amplitude and have opposite polarities in the same duration are applied to the drive electrodes E31A and E31B. Pulse voltages that have the third amplitude and have opposite polarities in the same duration are applied to the drive electrodes E22A and E22B. Pulse voltages that have the third amplitude and have opposite polarities in the same duration are applied to the drive electrodes E41A and E41B.

Potentials A and D are pulse voltages that have the fourth amplitude different from the third amplitude and have opposite polarities in the same duration. Specifically, the drive electrodes E11 of the first liquid crystal panel 10, the drive electrodes E32 of the third liquid crystal panel 30, the drive electrodes E21 of the second liquid crystal panel 20, and the drive electrodes E42 of the fourth liquid crystal panel 40 each include two drive electrodes alternately arranged when viewed in the Z direction, and pulse voltages that have the fourth amplitude and have opposite polarities in the same duration are applied to the two drive electrodes, respectively.

Specifically, pulse voltages that have the fourth amplitude and have opposite polarities in the same duration are applied to the drive electrodes E11A and E11B. Pulse voltages that have the fourth amplitude and have opposite polarities in the same duration are applied to the drive electrodes E32A and E32B. Pulse voltages that have the fourth amplitude and have opposite polarities in the same duration are applied to the drive electrodes E21A and E21B. Pulse voltages that have the fourth amplitude and have opposite polarities in the same duration are applied to the drive electrodes E42A and E42B.

As described above with reference to FIG. 17, between the time when S-waves enter the first liquid crystal panel 10 and the time when they exit from the fourth liquid crystal panel 40, the S-waves are diffused twice in the X-axis direction and twice in the Y-axis direction. Between the time when P-waves enter the first liquid crystal panel 10 and the time when they exit from the fourth liquid crystal panel 40, the P-waves are diffused twice in the X-axis direction and twice in the Y-axis direction. In other words, diffusion occurs four times in the X-axis direction and four times in the Y-axis direction in total. Consequently, the elliptical light distribution pattern is formed as illustrated in FIG. 25B.

(5) Circular Light Distribution Pattern

As illustrated in FIG. 26A, potentials A and B are the same, and potentials C and D are the same. Potentials A and B are the low-level voltage VL of −a V and potentials C and D are the high-level voltage VH of a V in one duration, and potentials A and B are the high-level voltage VH of a V and potentials C and D are the low-level voltage VL of −a V in the next duration. In this case, the potential difference between electrodes each extending in the X direction and the potential difference between electrodes each extending in the Y direction are equal in the elliptical light distribution pattern described above in (4), and therefore, the size (diffusion degree) of light distribution are equal between the X and Y directions. As a result, the circular light distribution pattern is formed.

As described above, the illumination device 100 includes the two control substrates 5A and 5B, the two relay substrate 4A and 4B electrically coupled to the two control substrates 5A and 5B through respective wire harnesses 210, and the four liquid crystal panels 1A electrically coupled to the two relay substrates 4A and 4B through the flexible printed circuit boards 200. Two of the four liquid crystal panels 1A are electrically coupled to the relay substrate 4A (one of the two relay substrates) through the corresponding flexible printed circuit boards 200. The other two of the four liquid crystal panels 1A are electrically coupled to the relay substrate 4B (the other of the two relay substrates) through the corresponding flexible printed circuit boards 200.

Thus, one control substrate 5 and one relay substrate 4 are coupled to each other through one wire harness 210, and one relay substrate 4 and two liquid crystal panels 1A are coupled to each other through two flexible printed circuit boards 200. In other words, the number of wire harnesses 210 coupling the control substrates 5 and the relay substrates 4 is half the number of flexible printed circuit boards 200 coupling the liquid crystal panels 1A and the relay substrates 4. Thus, force applied to coupling parts of the wire harnesses 210 and the relay substrates 4 or coupling parts of the wire harnesses 210 and the control substrates 5 when the liquid crystal panels 1A and the relay substrates 4 are rotated relative to the control substrates 5 and the wire harnesses 210 are twisted, decreases as compared to a case where the number of wire harnesses 210 coupling the control substrates 5 and the relay substrates 4 is equal to the number of flexible printed circuit boards 200 coupling the liquid crystal panels 1A and the relay substrates 4. With this configuration, in the illumination device 100 that rotates the light distribution pattern about an axial center (center axis AX), it is possible to reduce damage on coupling portions between wiring (flexible printed circuit boards 200) and the liquid crystal panels 1A or coupling portions between wiring (wire harnesses 210) and the control substrates 5.

The wire harnesses 210 and the flexible printed circuit boards 200 are provided with signal lines. The signal lines of the wire harnesses 210 are bifurcated at the relay substrates 4 and coupled to the signal lines of the flexible printed circuit boards 200.

In a case where the signal lines of the wire harnesses 210 are not bifurcated at the relay substrates 4, one control substrate 5 is needed for one liquid crystal panel 1A, and accordingly, four control substrates 5 are needed for the four liquid crystal panels 1A. Thus, according to the present embodiment, the number of control substrates 5 can be set to be smaller. Since the decrease in the number of control substrates 5 leads to the decrease in the number of wire harnesses 210, the number of coupling parts of the wire harnesses 210 and the control substrates 5 decreases as well. Thus, force applied to coupling parts of the wire harnesses 210 and the control substrates 5 decreases and damage on the coupling parts can be reduced.

The wire harnesses 210 are longer than the flexible printed circuit boards 200.

The wire harnesses 210 are twisted when the liquid crystal panels 1A are rotated relative to the control substrates 5. However, since the lengths of the wire harnesses 210 are longer, force applied to coupling parts between the wire harnesses 210 and the relay substrates 4 or coupling parts between the wire harnesses 210 and the control substrates 5 decreases, and damage on the coupling parts can be reduced. The lengths of the flexible printed circuit boards 200 can be set to be shorter, and thus the length of the holding member 2 in the axial direction can be shortened to achieve downsizing of the illumination device 100.

The illumination device 100 further includes the holding member 2 that holds the four liquid crystal panels 1A and the two relay substrates 4, and the held member 3 that supports the holding member 2 rotatably in the direction about the center axis AX and to which the two control substrates 5A and 5B are attached.

With this configuration, in a case where the light distribution pattern is elongated in one direction (for example, the vertical direction or the horizontal direction), the light distribution pattern can be rotated about the center axis AX, and thus the light distribution pattern can be provided in various kinds of variations. For example, as described above with reference to FIG. 13, the light distribution pattern 601 having an elliptical shape that is long along the Y axis can be changed to the light distribution pattern 602 through rotation by 45° in the counterclockwise direction.

The four liquid crystal panels 1A are the first liquid crystal panel 10, the second liquid crystal panel 20, the third liquid crystal panel 30, and the fourth liquid crystal panel 40 that are stacked sequentially from the Z2 side (one side in the first direction) toward the Z1 side (the other side in the first direction). The initial light distribution direction on the first substrate side in each of the first liquid crystal panel 10 and the second liquid crystal panel 20 is orthogonal to (intersects) the initial light distribution direction on the first substrate side in each of the third liquid crystal panel 30 and the fourth liquid crystal panel 40 when viewed in the Z direction. The relay substrate 4A is electrically coupled to the drive electrodes E11, E12, E31, and E32. The relay substrate 4B is electrically coupled to the drive electrodes E21, E22, E41, and E42.

With the illumination device 100 thus configured, it is possible to form various light distribution patterns including the horizontal line shaped light distribution pattern, the vertical line shaped light distribution pattern, the elliptical light distribution pattern, and the circular light distribution pattern.

The drive electrodes E12 in the first liquid crystal panel 10, the drive electrodes E31 in the third liquid crystal panel 30, the drive electrodes E22 in the second liquid crystal panel 20, and the drive electrodes E41 in the fourth liquid crystal panel 40 each include two drive electrodes alternately arranged when viewed in the Z direction, and pulse voltages that have the first amplitude and have opposite polarities in the same duration are applied to the two drive electrodes, respectively.

With this configuration and operation mode, it is possible to form the horizontal line shaped light distribution pattern. Since the holding member 2 is supported rotatably relative to the held member 3, it is possible to rotate the horizontal line shaped light distribution pattern.

The drive electrodes E11 in the first liquid crystal panel 10, the drive electrodes E32 in the third liquid crystal panel 30, the drive electrodes E21 in the second liquid crystal panel 20, and the drive electrodes E42 in the fourth liquid crystal panel 40 each include two drive electrodes alternately arranged when viewed in the Z direction, and pulse voltages that have the second amplitude and have opposite polarities in the same duration are applied to the two drive electrodes, respectively.

With this configuration and operation mode, it is possible to form the vertical line shaped light distribution pattern. Since the holding member 2 is supported rotatably relative to the held member 3, it is possible to rotate the vertical line shaped light distribution pattern.

The drive electrodes E12 in the first liquid crystal panel 10 and the drive electrodes E31 in the third liquid crystal panel 30 each include two drive electrodes alternately arranged when viewed in the Z direction, and pulse voltages that have the third amplitude and have opposite polarities in the same duration are applied to the two drive electrodes, respectively.

The drive electrodes E21 in the second liquid crystal panel 20 and the drive electrodes E42 in the fourth liquid crystal panel 40 each include two drive electrodes alternately arranged when viewed in the Z direction, and pulse voltages that have the fourth amplitude different from the third amplitude and have opposite polarities in the same duration are applied to the two drive electrodes, respectively.

With this configuration and operation mode, it is possible to form the elliptical light distribution pattern. Since the holding member 2 is supported rotatably relative to the held member 3, it is possible to rotate the elliptical light distribution pattern.

The drive electrodes E11, E21, E31, E41 and the drive electrodes E12, E22, E32, E42 each include two drive electrodes alternately arranged when viewed in the Z direction, and pulse voltages that have the fifth amplitude and have opposite polarities in the same duration are applied to the two drive electrodes, respectively.

With this configuration and operation mode, it is possible to form the circular light distribution pattern.

Second Embodiment

The following describes a second embodiment, mainly on contents different from those of the first embodiment. Specifically, the second embodiment is different from the first embodiment in that a cross-shaped light distribution pattern can be formed. Detailed description is given below.

Entire Configuration of Illumination Device

Figure 29A:
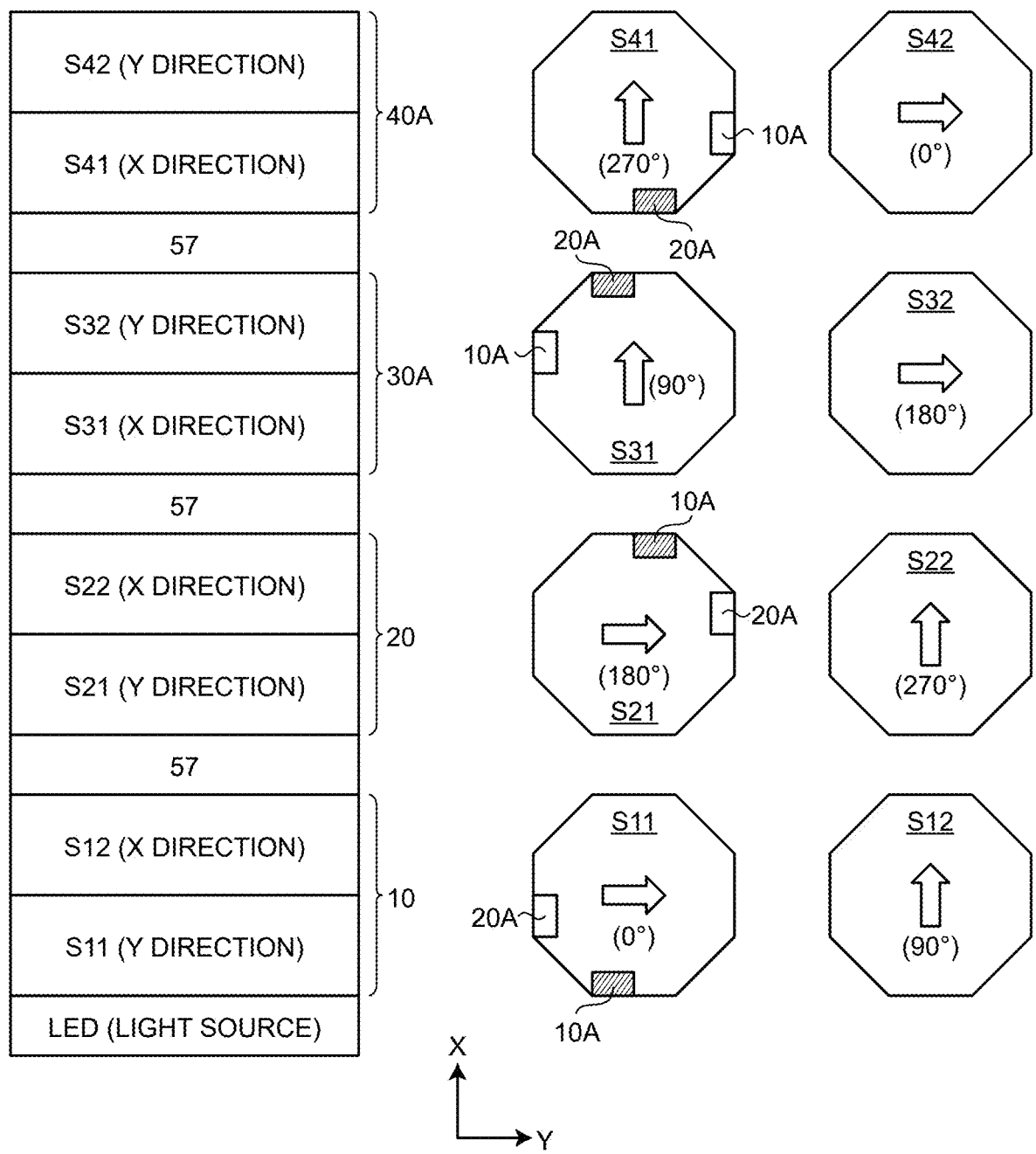
FIG. 29A is a schematic diagram illustrating an arrangement of the first substrate and the second substrate in each of the four liquid crystal panels.

FIG. 27 is a schematic diagram illustrating the entire configuration of liquid crystal panels, relay substrates, and control substrates according to the second embodiment. FIG. 28 is a sectional view illustrating a state in which four liquid crystal panels are stacked. FIG. 29A is a schematic diagram illustrating an arrangement of the first substrate and the second substrate in each of the four liquid crystal panels. FIG. 29B is a diagram for entire description of polarized waves subjected to action of each of the four liquid crystal panels, the diffusion direction of the polarized waves, and the potential of terminals.

As illustrated in FIGS. 27, 28, 29A, and 29B, in the second embodiment, the first liquid crystal panel 10, the second liquid crystal panel 20, a third liquid crystal panel 30A, and a fourth liquid crystal panel 40A are stacked in order of proximity to the LED 110 as a light source. As illustrated in FIG. 28, the flexible printed circuit board 201A is joined to the first liquid crystal panel 10, the flexible printed circuit board 202A is joined to the second liquid crystal panel 20, the flexible printed circuit board 203A is joined to the third liquid crystal panel 30A, and the flexible printed circuit board 204A is joined to the fourth liquid crystal panel 40A. The flexible printed circuit boards 201A and 204A extend in the same direction, and the flexible printed circuit boards 202A and 203A extend in the same direction. The flexible printed circuit boards 201A and 204A and the flexible printed circuit boards 202A and 203A extend in opposite directions.

As illustrated in FIG. 29A, the third liquid crystal panel 30A is disposed with rotation by 90° in the clockwise direction relative to the first liquid crystal panel 10, and the flexible printed circuit board 203A is electrically coupled to the second terminal group 20A of the first substrate S31 (refer to FIG. 28). The fourth liquid crystal panel 40A is disposed with rotation by 270° in the clockwise direction relative to the first liquid crystal panel 10, and the flexible printed circuit board 204A is electrically coupled to the second terminal group 20A of the first substrate S41 (refer to FIG. 28).

As illustrated in FIG. 27, in the second embodiment, liquid crystal panels 1A different from those in the first embodiment are coupled to the relay substrate 4A and 4B. Specifically, the first liquid crystal panel 10 and the fourth liquid crystal panel 40A are coupled to the relay substrate 4A, and the second liquid crystal panel 20 and the third liquid crystal panel 30A are coupled to the relay substrate 4B.

In the fourth liquid crystal panel 40A, the fifth terminal 201, the sixth terminal 202, the seventh terminal 203, and the eighth terminal 204 are coupled to the connector 631 of the relay substrate 4A. More specifically, the fifth terminal 201 and the connector 631 are coupled to each other through the signal line 705. The sixth terminal 202 and the connector 631 are coupled to each other through the signal line 706. The seventh terminal 203 and the connector 631 are coupled to each other through the signal line 707. The eighth terminal 204 and the connector 631 are coupled to each other through the signal line 708.

The signal lines 701 and 707 are electrically coupled to the signal line 709 through the connectors 631 and 632. In other words, two signal lines are coupled to one signal line through the connectors 631 and 632. This configuration is the same for the other signal lines: two signal lines are coupled to one signal line.

Specifically, the signal lines 702 and 708 are electrically coupled to the signal line 710 through the connectors 631 and 632. The signal lines 703 and 705 are electrically coupled to the signal line 711 through the connectors 631 and 632. The signal lines 704 and 706 are electrically coupled to the signal line 712 through the connectors 631 and 632.

One signal line on the relay substrate 4A (for example, the signal line 709) is electrically coupled through the connector 633 to one signal line (for example, the signal line 713) of the corresponding wire harness 210.

The following describes the potential of each signal line. The signal lines 702, 708, 710, and 714 have potential A. The signal lines 701, 707, 709, and 713 have potential B. The signal lines 704, 706, 712, and 716 have potential C. The signal lines 703, 705, 711, and 715 have potential D.

As illustrated in FIG. 27, in the third liquid crystal panel 30A, the fifth terminal 201, the sixth terminal 202, the seventh terminal 203, and the eighth terminal 204 are coupled to the connector 635 of the relay substrate 4B. More specifically, the fifth terminal 201 and the connector 635 are coupled to each other through the signal line 725. The sixth terminal 202 and the connector 635 are coupled to each other through the signal line 726. The seventh terminal 203 and the connector 635 are coupled to each other through the signal line 727. The eighth terminal 204 and the connector 635 are coupled to each other through the signal line 728.

The signal lines 721 and 727 are electrically coupled to the signal line 729 through the connectors 634 and 635. In other words, two signal lines are coupled to one signal line through the connectors 634 and 635. This configuration is the same for the other signal lines: two signal lines are coupled to one signal line. Specifically, the signal lines 722 and 728 are electrically coupled to the signal line 730 through the connectors 634 and 635. The signal lines 723 and 725 are electrically coupled to the signal line 731 through the connectors 634 and 635. The signal lines 724 and 726 are electrically coupled to the signal line 732 through the connectors 634 and 635.

One signal line on the relay substrate 4B is electrically coupled to one signal line on the control substrate 5B through the connector 636.

The following describes the potential of each signal line. The signal lines 722, 728, 730, and 734 have potential A'. The signal lines 721, 727, 729, and 733 have potential B'. The signal lines 724, 726, 732, and 736 have potential C'. The signal lines 723, 725, 731, and 735 have potential D'.

Light Distribution Patterns

Figure 30A:
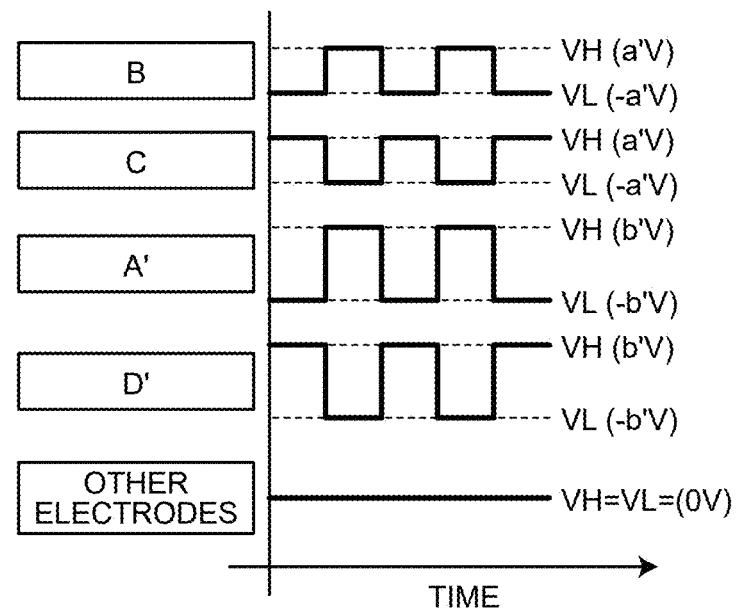
FIG. 30A is a diagram illustrating the waveforms of control signals applied to the electrodes that drive the liquid crystal in a cross-shaped light distribution pattern.
Figure 30B:
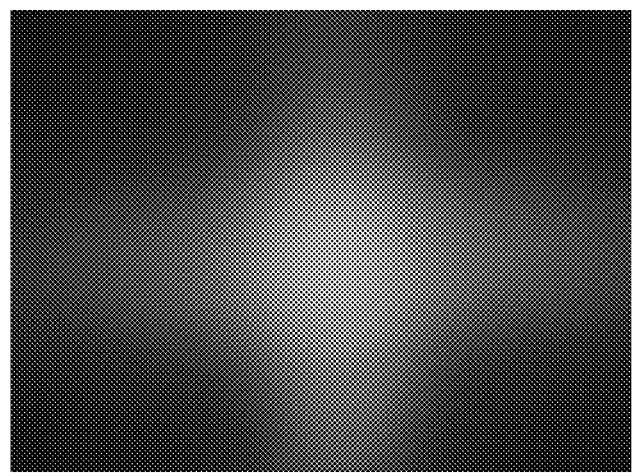
FIG. 30B is an image illustrating the cross-shaped light distribution pattern.
Figure 31:
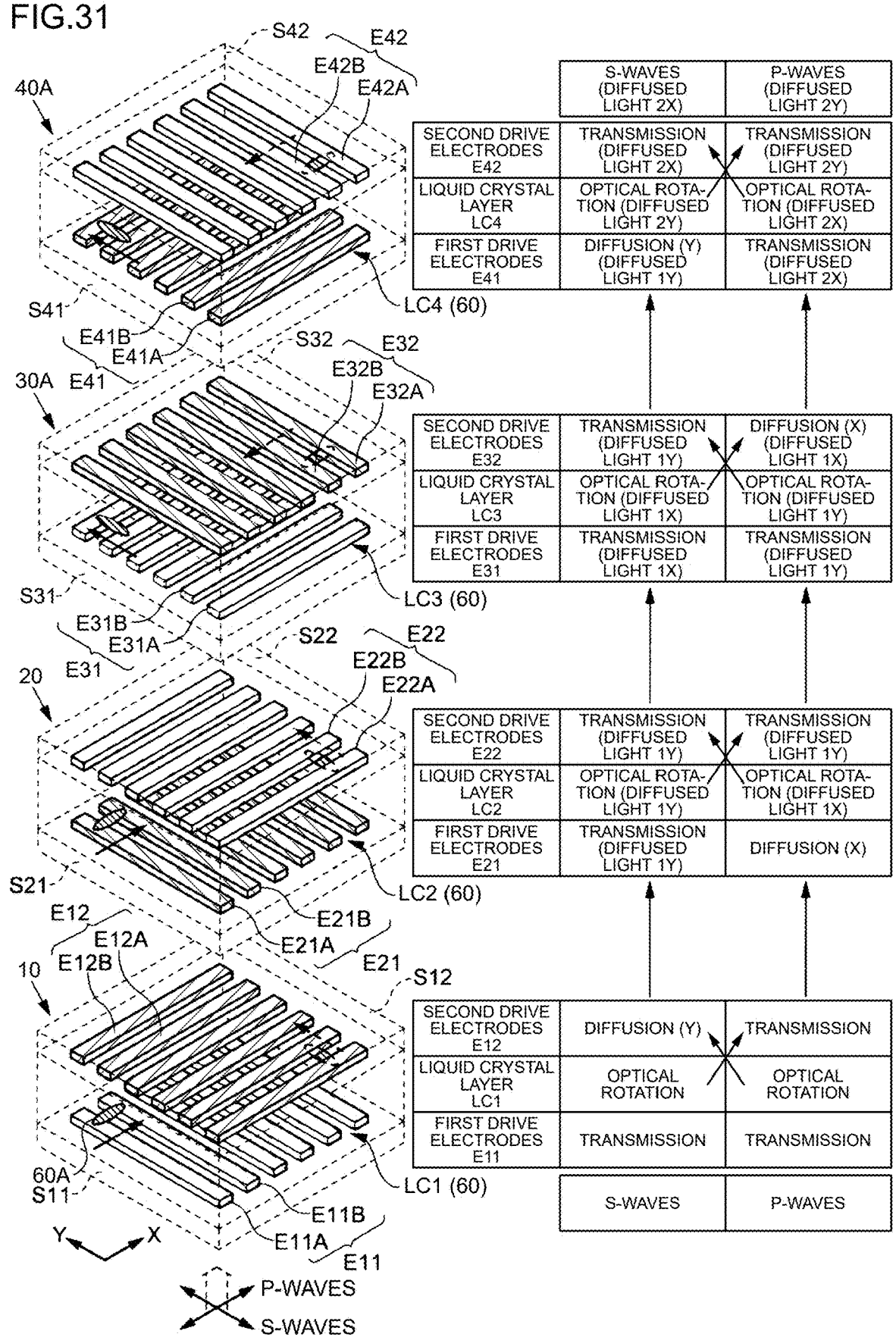
FIG. 31 is a schematic diagram for description of a state in which the cross-shaped light distribution pattern is formed by the four liquid crystal panels.

The following describes a light distribution pattern. FIG. 30A is a diagram illustrating the waveforms of control signals applied to the electrodes that drive the liquid crystal in the cross-shaped light distribution pattern. FIG. 30B is an image illustrating the cross-shaped light distribution pattern. FIG. 31 is a schematic diagram for description of a state in which the cross-shaped light distribution pattern is formed by the four liquid crystal panels.

(1) Cross-Shaped Light Distribution Pattern

The cross-shaped light distribution pattern is a light distribution pattern having a cross shape that is orthogonal to (intersecting) the vertical direction and the horizontal direction as illustrated in FIG. 30B, for example.

As illustrated in FIG. 30A, potentials B and C are alternately switched to the low-level voltage VL and the high-level voltage VH. The voltage VL is, for example, −a' V, and the voltage VH is, for example, a' V. Potentials A' and D' are alternately switched to the low-level voltage VL and the high-level voltage VH. The voltage VL is, for example −b' V, and the voltage VH is, for example, b' V. As illustrated in FIG. 30A, the other potentials than potentials B, C, A', and D' are all 0 V. Thus, as illustrated in FIG. 27, in the first liquid crystal panel 10, potentials B and C are applied to the drive electrodes E12 on the second substrate S12. In the second liquid crystal panel 20, potentials A' and D' are applied to the drive electrodes E21 on the first substrate S21. In the third liquid crystal panel 30A, potentials A' and D' are applied to the drive electrodes E32 on the second substrate S32. In the fourth liquid crystal panel 40A, potentials B and C are applied to the drive electrodes E41 on the first substrate S41.

In other words, the drive electrodes E12 in the first liquid crystal panel 10 and the drive electrodes E41 in the fourth liquid crystal panel 40A each include two drive electrodes alternately arranged when viewed in the Z direction, and pulse voltages that have the eleventh amplitude and have opposite polarities in the same duration are applied to the two drive electrodes, respectively. The drive electrodes E21 in the second liquid crystal panel 20 and the drive electrodes E32 in the third liquid crystal panel 30A each include two drive electrodes alternately arranged when viewed in the Z direction, and pulse voltages that have the twelfth amplitude different from the eleventh amplitude and have opposite polarities in the same duration are applied to the two drive electrodes, respectively.

The above-described configuration is illustrated in FIG. 31. In FIG. 31 as well, drive electrodes to which voltages are applied are hatched.

As illustrated in FIG. 31, S-waves after entering the first liquid crystal panel 10 are diffused twice in the X direction while passing through the first liquid crystal panel 10 to the fourth liquid crystal panel 40A. P-waves after entering the first liquid crystal panel 10 are diffused twice in the Y direction while passing through the first liquid crystal panel 10 to the fourth liquid crystal panel 40A. Detailed description is given below.

As illustrated in FIG. 31, S-waves after entering the first liquid crystal panel 10 are not diffused but are optically rotated and exit as P-waves from the first liquid crystal panel 10. The P-waves after entering the second liquid crystal panel 20 are diffused once in the X direction on the first substrate S21 side. Thereafter, the P-waves are optically rotated into S-waves and exit as S-waves from the second liquid crystal panel 20. The S-waves after entering the third liquid crystal panel 30A are diffused once in the X direction on the second substrate S32 side, optically rotated into P-waves, and exit as P-waves from the third liquid crystal panel 30A. The P-waves after entering the fourth liquid crystal panel 40A are not diffused but are optically rotated and exit as P-waves from the fourth liquid crystal panel 40A.

P-waves after entering the first liquid crystal panel 10 are diffused once in the Y direction on the second substrate S12 side. The P-waves are optically rotated into S-waves and exit as S-waves from the first liquid crystal panel 10. The S-waves after entering the second liquid crystal panel 20 are not diffused but are optically rotated and exit as P-waves from the second liquid crystal panel 20. The P-waves after entering the third liquid crystal panel 30A are not diffused but are optically rotated and exit as S-waves from the third liquid crystal panel 30A. The S-waves after entering the fourth liquid crystal panel 40A are diffused once in the Y direction on the first substrate S31 side, optically rotated into P-waves, and exit as P-waves from the fourth liquid crystal panel 40A. Since the voltage b' V is larger than the voltage a' V and the voltage −b' V is smaller than the voltage −a' V, the diffusion degree in the second liquid crystal panel 20 and the third liquid crystal panel 30A illustrated in FIG. 31 is larger than the diffusion degree in the first liquid crystal panel 10 and the fourth liquid crystal panel 40A. Since diffusion in the second liquid crystal panel 20 and the third liquid crystal panel 30A occurs in the X direction, the length of the cross light distribution in the X direction is longer than the length thereof in the Y direction.

As described above, the four liquid crystal panels 1A are the first liquid crystal panel 10, the second liquid crystal panel 20, the third liquid crystal panel 30A, and the fourth liquid crystal panel 40A that are stacked sequentially from the Z2 side toward the Z1 side. The initial light distribution direction on the first substrate side in each of the first liquid crystal panel 10 and the second liquid crystal panel 20 is orthogonal to (intersects) the initial light distribution direction on the first substrate side in each of the third liquid crystal panel 30 and the fourth liquid crystal panel 40A when viewed in the Z direction. The relay substrate 4A is electrically coupled to the first drive electrodes E11, the second drive electrodes E12, the first drive electrodes E41, and the second drive electrodes E42. The relay substrate 4B is electrically coupled to the first drive electrodes E21, the second drive electrodes E22, the first drive electrodes E31, and the second drive electrodes E32. Potentials B and C are applied to the drive electrodes E12 and E41 and potentials A' and D' are applied to the drive electrodes E21 and E32, and accordingly, the cross-shaped light distribution pattern can be formed.

Modification of Second Embodiment

In the second embodiment, it is possible to achieve the same potential state as in the first embodiment by setting potentials A', B', C', and D' illustrated in FIG. 27 to potentials A, B, C, and D, respectively (in other words, setting potential A'=potential A, potential B'=potential B, potential C'=potential C, and potential D'=potential D). The following briefly describes the light distribution pattern according to a modification of the second embodiment. In the modification, the potential state and the light distribution state are basically the same as in the first embodiment.

(1) Narrow Light Distribution Pattern

As described above, potentials A and A' are equal, potentials B and B' are equal, potentials C and C' are equal, and potentials D and D' are equal. Thus, the narrow light distribution pattern according to the modification is the same as in the first embodiment.

(2) Horizontal Line Shaped Light Distribution Pattern

The drive electrodes E12 in the first liquid crystal panel 10, the drive electrodes E41 in the fourth liquid crystal panel 40A, the drive electrodes E22 in the second liquid crystal panel 20, and the drive electrodes E31 in the third liquid crystal panel 30A each include two drive electrodes alternately arranged when viewed in the Z direction, and pulse voltages that have the sixth amplitude and have opposite polarities in the same duration are applied to the two drive electrodes, respectively. Thus, the horizontal line shaped light distribution pattern extending long in the horizontal direction is formed with the same operation mode as in the first embodiment.

(3) Vertical Line Shaped Light Distribution Pattern

The drive electrodes E11 in the first liquid crystal panel 10, the drive electrodes E42 in the fourth liquid crystal panel 40A, the drive electrodes E21 in the second liquid crystal panel 20, and the drive electrodes E32 in the third liquid crystal panel 30A each include two drive electrodes alternately arranged when viewed in the Z direction, and pulse voltages that have the seventh amplitude and have opposite polarities in the same duration are applied to the two drive electrodes, respectively. Thus, the vertical line shaped light distribution pattern extending long in the vertical direction is formed with the same operation mode as in the first embodiment.

(4) Elliptical Light Distribution Pattern

The elliptical light distribution pattern is the same as the elliptical light distribution pattern as in the first embodiment.

Potentials A and A' are equal, potentials B and B' are equal, potentials C and C' are equal, and potentials D and D' are equal. This is the same configuration as in FIG. 25A according to the first embodiment.

The drive electrodes E12 in the first liquid crystal panel 10 and the drive electrodes E41 in the fourth liquid crystal panel 40A each include two drive electrodes alternately arranged when viewed in the Z direction, and pulse voltages that have the eighth amplitude and have opposite polarities in the same duration are applied to the two drive electrodes, respectively. The drive electrodes E21 in the second liquid crystal panel 20 and the drive electrodes E32 in the third liquid crystal panel 30A each include two drive electrodes alternately arranged when viewed in the Z direction, and pulse voltages that have the ninth amplitude different from the eighth amplitude and have opposite polarities in the same duration are applied to the two drive electrodes, respectively. Thus, the elliptical light distribution pattern is formed with the same operation mode as in the first embodiment.

(5) Circular Light Distribution Pattern

The drive electrodes E11 in the first liquid crystal panel 10, the drive electrodes E12 in the first liquid crystal panel 10, the drive electrodes E41 in the fourth liquid crystal panel 40A, the drive electrodes E42 in the fourth liquid crystal panel 40A, the drive electrodes E21 in the second liquid crystal panel 20, the drive electrodes E22 in the second liquid crystal panel 20, the drive electrodes E31 in the third liquid crystal panel 30A, and the drive electrodes E32 in the third liquid crystal panel 30A each include two drive electrodes alternately arranged when viewed in the Z direction, and pulse voltages that have the tenth amplitude and have opposite polarities in the same duration are applied to the two drive electrodes, respectively. Thus, the circular light distribution pattern is formed with the same operation mode as in the first embodiment.

What is claimed is:

1. An illumination device comprising:
   two control substrates;
   two relay substrates electrically coupled to the two respective control substrates through respective wire harnesses; and
   four liquid crystal panels electrically coupled to the two relay substrates through flexible printed circuit boards, wherein
   four of the flexible printed circuit boards are provided,
   two of the four liquid crystal panels are electrically coupled to one of the two relay substrates through the corresponding flexible printed circuit boards,
   the other two of the four liquid crystal panels are electrically coupled to the other of the two relay substrates through the corresponding flexible printed circuit boards, and
   the four liquid crystal panels are provided in a state of being stacked in a first direction.

2. The illumination device according to claim 1, wherein the wire harnesses and the flexible printed circuit boards are provided with signal lines, and
   the signal lines of the wire harnesses are bifurcated at the relay substrates and coupled to the signal lines of the flexible printed circuit boards.

3. The illumination device according to claim 1, wherein the wire harnesses are longer than the flexible printed circuit boards.

4. The illumination device according to claim 1, further comprising:
   a holding member that has a center axis extending in the first direction and holds the four liquid crystal panels and the two relay substrates; and
   a held member that supports the holding member rotatably in a direction about the center axis and to which a light source and the two control substrates are attached.

5. The illumination device according to claim 4, wherein the four liquid crystal panels are a first liquid crystal panel, a second liquid crystal panel, a third liquid crystal panel, and a fourth liquid crystal panel that are stacked sequentially from one side in the first direction toward the other side,
   each of the first liquid crystal panel and the second liquid crystal panel includes a first substrate on the one side in the first direction, a second substrate on the other side in the first direction, a liquid crystal layer provided between the first substrate and the second substrate, a first drive electrode provided on the first substrate, and a second drive electrode provided on the second substrate and extending in a direction intersecting the first drive electrode when viewed in the first direction, and an initial light distribution direction on the first substrate side intersects an initial light distribution direction on the second substrate side when viewed in the first direction, each of the third liquid crystal panel and the fourth liquid crystal panel includes a first substrate on the one side in the first direction, a second substrate on the other side in the first direction, a liquid crystal layer provided between the first substrate and the second substrate, a first drive electrode provided on the first substrate, and a second drive electrode provided on the second substrate and extending in a direction intersecting the first drive electrode when viewed in the first direction, and an initial light distribution direction on the first substrate side intersects an initial light distribution direction on the second substrate side when viewed in the first direction, the initial light distribution direction on the first substrate side in each of the first liquid crystal panel and the second liquid crystal panel intersects the initial light distribution direction on the first substrate side in each of the third liquid crystal panel and the fourth liquid crystal panel when viewed in the first direction, the one of the two relay substrates is electrically coupled to the first drive electrode and the second drive electrode of the first liquid crystal panel and the first drive electrode and the second drive electrode of the third liquid crystal panel, and the other of the two relay substrates is electrically coupled to the first drive electrode and the second drive electrode of the second liquid crystal panel and the first drive electrode and the second drive electrode of the fourth liquid crystal panel.

6. The illumination device according to claim 4, wherein the four liquid crystal panels are a first liquid crystal panel, a second liquid crystal panel, a third liquid crystal panel, and a fourth liquid crystal panel that are stacked sequentially from one side in the first direction toward the other side, each of the first liquid crystal panel and the second liquid crystal panel includes a first substrate on the one side in the first direction, a second substrate on the other side in the first direction, a liquid crystal layer provided between the first substrate and the second substrate, a first drive electrode provided on the first substrate, and a second drive electrode provided on the second substrate and extending in a direction intersecting the first drive electrode when viewed in the first direction, and an initial light distribution direction on the first substrate side intersects an initial light distribution direction on the second substrate side when viewed in the first direction, each of the third liquid crystal panel and the fourth liquid crystal panel includes a first substrate on the one side in the first direction, a second substrate on the other side in the first direction, a liquid crystal layer provided between the first substrate and the second substrate, a first drive electrode provided on the first substrate, and a second drive electrode provided on the second substrate and extending in a direction intersecting the first drive electrode when viewed in the first direction, and an initial light distribution direction on the first substrate side intersects an initial light distribution direction on the second substrate side when viewed in the first direction, the initial light distribution direction on the first substrate side in each of the first liquid crystal panel and the second liquid crystal panel intersects the initial light distribution direction on the first substrate side in each of the third liquid crystal panel and the fourth liquid crystal panel when viewed in the first direction, the one of the two relay substrates is electrically coupled to the first drive electrode and the second drive electrode of the first liquid crystal panel and the first drive electrode and the second drive electrode of the fourth liquid crystal panel, and the other of the two relay substrates is electrically coupled to the first drive electrode and the second drive electrode of the second liquid crystal panel and the first drive electrode and the second drive electrode of the third liquid crystal panel.

7. The illumination device according to claim 6, wherein the second drive electrode of the first liquid crystal panel and the first drive electrode of the fourth liquid crystal panel each include two drive electrodes alternately arranged when viewed in the first direction, and pulse voltages that have an eleventh amplitude and have opposite polarities in same duration are applied to the two drive electrodes, respectively, and the first drive electrode of the second liquid crystal panel and the second drive electrode of the third liquid crystal panel each include two drive electrodes alternately arranged when viewed in the first direction, and pulse voltages that have a twelfth amplitude different from the eleventh amplitude and have opposite polarities in the same duration are applied to the two drive electrodes, respectively.

* * * * *